United States Patent
Furukawa et al.

(10) Patent No.: US 7,598,755 B2
(45) Date of Patent: *Oct. 6, 2009

(54) PROBE NAVIGATION METHOD AND DEVICE AND DEFECT INSPECTION DEVICE

(75) Inventors: Takashi Furukawa, Sagamihara (JP); Takayuki Mizuno, Akishima (JP); Eiichi Hazaki, Tsuchiura (JP); Hirofumi Sato, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/118,421

(22) Filed: May 9, 2008

(65) Prior Publication Data

US 2008/0218185 A1    Sep. 11, 2008

Related U.S. Application Data

(63) Continuation of application No. 11/397,677, filed on Apr. 5, 2006, now Pat. No. 7,372,283.

(51) Int. Cl.
*G01R 31/02* (2006.01)
*G01R 31/00* (2006.01)

(52) U.S. Cl. .......... 324/753; 324/751; 324/752; 324/158.1; 324/754; 250/492.2

(58) Field of Classification Search ......... 324/754–765; 250/492.2
See application file for complete search history.

(56) References Cited

U.S. PATENT DOCUMENTS

| | | | |
|---|---|---|---|
| 4,772,846 A | 9/1988 | Reeds | |
| 5,493,236 A * | 2/1996 | Ishii et al. | 324/752 |
| 5,521,517 A * | 5/1996 | Shida et al. | 324/751 |
| 6,636,824 B1 | 10/2003 | Sawai et al. | |
| 6,734,687 B1 | 5/2004 | Ishitani et al. | |
| 6,970,004 B2 | 11/2005 | Ishitani et al. | |
| 7,071,713 B2 | 7/2006 | Furukawa et al. | |
| 7,109,483 B2 | 9/2006 | Nakasuji et al. | |
| 7,230,240 B2 * | 6/2007 | Siebert et al. | 250/306 |
| 7,372,283 B2 * | 5/2008 | Furukawa et al. | 324/750 |
| 2003/0184332 A1 | 10/2003 | Tomimatsu et al. | |
| 2006/0118733 A1 * | 6/2006 | Kiyohara et al. | 250/491.1 |
| 2006/0231773 A1 * | 10/2006 | Katagiri et al. | 250/492.1 |

FOREIGN PATENT DOCUMENTS

| | | |
|---|---|---|
| JP | 07-240446 | 9/1995 |
| JP | 08-054447 | 2/1996 |
| JP | 2000-147070 | 5/2000 |

* cited by examiner

*Primary Examiner*—Ha Tran T Nguyen
*Assistant Examiner*—Emily Y Chan
(74) *Attorney, Agent, or Firm*—Antonelli, Terry, Stout & Kraus, LLP.

(57) ABSTRACT

A probe navigation method, a navigation device, and a defect inspection device wherein in a charged particle beam system provided with probes for electrical characteristics evaluation, probing can be easily carried out regardless of the equipment user's level of skill are provided. To attain this object, probes and a test piece stage on which a test piece is placed are driven by independent driving means. Further, a large stage driving means which integrally drives the probes and the test piece stage is provided. In addition, CAD navigation is adopted. This enhances the equipment users' convenience during probing.

18 Claims, 17 Drawing Sheets

(a) SEM image (b) CAD image

106 : Probe
118 : Test piece
301 : Plug
302 : Plug
303 : Wiring

CAD image at low magnification

501 : Peripheral circuit
502 : Circuit to be measured
503 : Related circuit
504 : Measuring point indicating arrow CAD image at high magnification 601 : Defect inspection device
602 : CAD WS
603 : Communication line 701 : Insulating plate (a) SEM image (b) EBAC image (c) CAD image 106 : Probe
118 : Test piece
801 : Plug
802 : Plug
803 : Internal wiring
804 : Break

PROBE NAVIGATION METHOD AND DEVICE AND DEFECT INSPECTION DEVICE

CROSS-REFERENCE TO RELATED APPLICATION

This application is a Continuation application of application Ser. No. 11/397,677, filed Apr. 5, 2006, now U.S. Pat. No. 7,372,283 which claims priority from 11/018,356, filed Dec. 22, 2004, now U.S. Pat. No. 7,071,713, which claims priority from Japanese Patent Application No. 2003-426169, filed Dec. 24, 2003, and Japanese Patent Application No. 2004-297115, filed Oct. 12, 2004, the disclosure of which is hereby incorporated by reference.

FIELD OF THE INVENTION

The present invention relates to a method for positioning probes in a defect inspection device which measures the electrical characteristics of electronic devices using the minute probes, and to a defect inspection device using the positioning method.

BACKGROUND OF THE INVENTION

Varied inspection equipment is conventionally known for detecting electrical defects in minute electronic circuits formed on a semiconductor chip. Such inspection equipment includes EB tester (Electron Beam tester) and prober device. The EB tester is a device for detecting points of electrical defect in LSIs. This detection is carried out by irradiating a point of measurement with an electron beam utilizing the following phenomenon: the amount of secondary electron emission from the point of measurement when irradiated with an electron beam varies depending on the value of voltage of the point of measurement. The prober device is a device for measuring the electrical characteristics of LSIs. This measurement is carried out by bringing a plurality of mechanical probes, disposed in correspondence with the positions of pads for characteristics measurement on LSIs, into contact with the measuring pads. In such an EB tester or prober device, the equipment operator manually confirms the probing positions of probes while viewing images, such as optical microscope images and SEM (Scanning Electron Microscope) images of wiring.

Recently, circuit patterns formed on semiconductor devices, such as LSIs, have been increasingly microminiaturized and complicated. It is becoming difficult to move probes to optimum probing positions in a short time. To cope with this, techniques designated as CAD navigation have been developed for shortening the time required for probing. The CAD navigation is such that the wiring layout of a semiconductor device is displayed in alignment with the actual image of the semiconductor device viewed by the equipment operator during probing. For example, Patent Document 1 discloses an example of an EB tester using CAD navigation. Patent Document 2 discloses an example in which CAD navigation is applied to FIB (Focused Ion Beam) processing equipment. In the technique disclosed in Patent Document 2, a secondary electron image produced by a test piece to be processed when the test piece is irradiated with a focused ion beam is observed. In this way, an appropriate position of ion beam irradiation is determined.

The techniques disclosed in Patent Documents 1 and 2 are those for carrying out defect inspection on semiconductor chips. There is also demand for carrying out defect inspection on wiring patterns on semiconductor wafers before they are formed into chips. Patent Document 3 discloses a technique for moving probes to positions of FIB processing so as to move a processed piece, obtained by FIB processing, from a predetermined position in the wiring pattern on a wafer by the probes. More specifically, FIB processing equipment is provided with a probe information screen for displaying the image of the tip of a probe. The equipment user specifies a target location to which the probe is to be moved on the probe information screen. The equipment computes the difference between the inputted target location and the present position of the tip of the probe, and moves the probe to the target location. Thus, when the probe is moved to a target location on a wafer, a burden on the equipment user can be lessened.

[Patent Document 1] Japanese Patent Laid-Open No. H7 (1995)-240446

[Patent Document 2] Japanese Patent Laid-Open No. H8 (1996)-54447

[Patent Document 3] Japanese Patent Laid-Open No. 2000-147070

SUMMARY OF THE INVENTION

Recently, wiring patterns formed on semiconductor wafers have been increasingly microminiaturized. The positioning accuracy demanded in probing is presently on the order of nm. It is difficult to automatize probing with such high accuracy with the present technology, and there is no other choice but to manually perform probing operation. Further, the size of wafers used in the manufacturing processes for semiconductor devices has been increased as compared with conventional wafers. This increases a burden on equipment users during probing operation. This is because of the following: increase in the size of wafers means increase in the frequency of changing the magnification of an image for probe check when a probe is moved. Each time the magnification is changed, the equipment user must move the probe so that the probe will come into the filed of view embracing the image. To lessen a burden on the equipment user, CAD navigation can be introduced. However, it cannot be said that the conventional equipment has a configuration optimum for the introduction of CAD navigation.

Some examples will be taken. The equipment disclosed in Patent Document 2 uses CAD navigation only for checking whether pads for measurement are positioned directly under a probe card or not. Patent Document 2 does not disclose a technique for positioning probes in arbitrary locations on a wafer. Since Patent Document 1 relates to EB tester, it does not disclose a technique related to the movement of probes. Patent Document 3 does not originally involve the disclosure of CAD navigation.

Consequently, an object of the present invention is to provide a probe navigation method and device and a defect inspection device wherein in a charged particle beam system equipped with probes for electrical characteristics evaluation, probing can be easily carried out regardless of the equipment user's level of skill.

According to the present invention, a charged particle beam system equipped with at least one probe for electrical characteristics evaluation comprises: a test piece stage for holding a test piece; a means for acquiring the charged particle beam image of the test piece; a first driving means for driving probes; a second driving means for moving the test piece stage; a third driving means which drives the test piece stage and the probes as integrated into one; and a controlling means for controlling these three driving means. This charged particle beam system attains the above object by the following operation: according to set values inputted by the equipment user or established beforehand, it operates the third driving means so that at least one probe will come into the field of view embracing the charged particle beam image. Further, it moves the test piece stage so that the probing location will come into the field of view embracing the charged particle beam image.

DESCRIPTION OF THE PREFERRED EMBODIMENT

Figure 1:
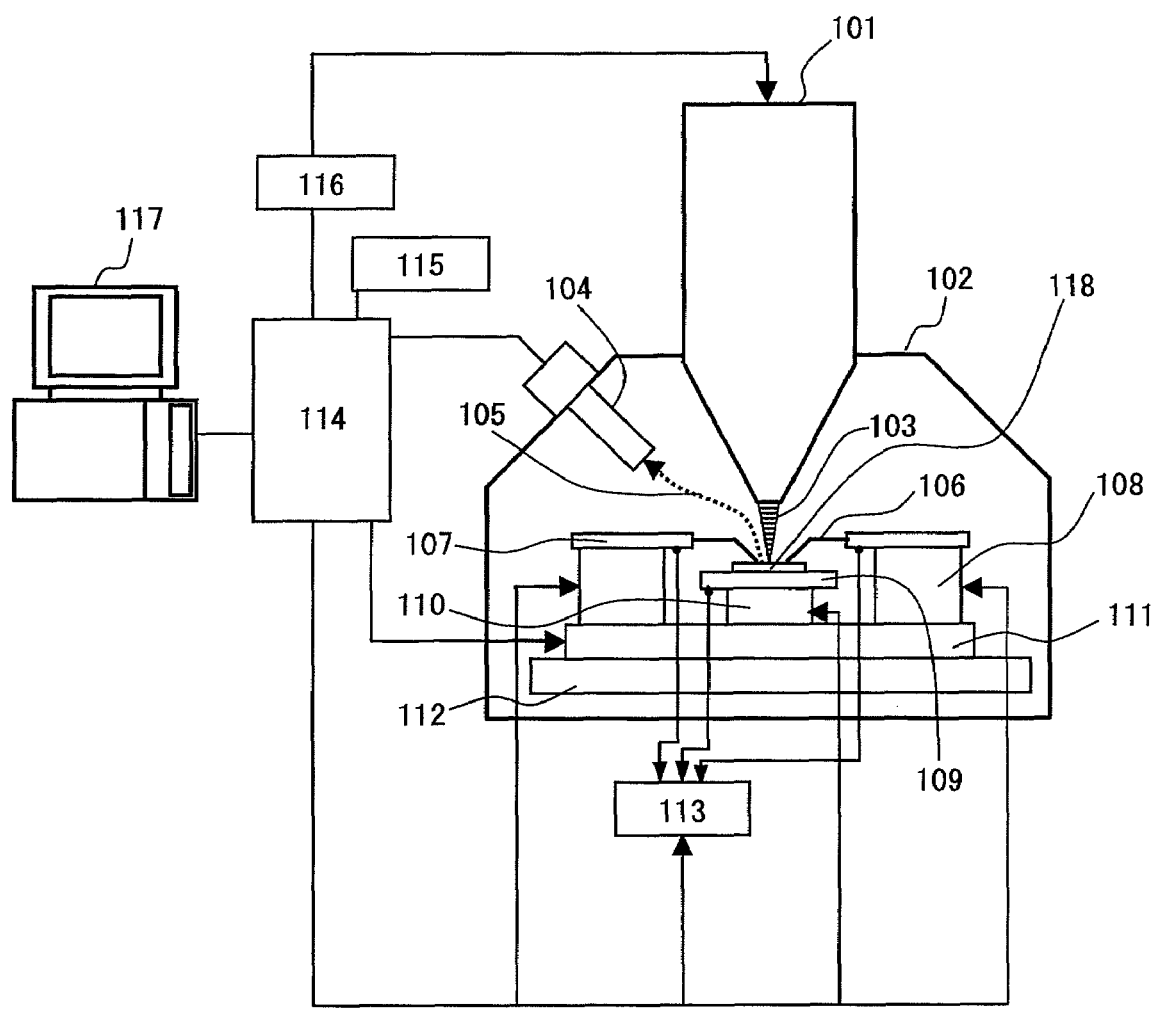
FIG. 1 is a drawing illustrating an example of the configuration of a defect inspection device.

Hereafter, description will be given to embodiments of the present invention, referring to the drawings. The term "probe" found in the following description refers to a mechanical probe, but it is not used to refer to any other probe, such as electron beam probe.

First Embodiment

Description will be given to a first embodiment which involves a defect inspection device with mechanical probes for electrical characteristics evaluation incorporated into the test piece chamber of SEM. FIG. 1 illustrates an example of the configuration of a defect inspection device in which a probe navigation method of the first embodiment is implemented. FIGS. 2A to 2D illustrate the basic flow of inspection carried out using the inspection device of the first embodiment. First, the configuration of the inspection device will be described referring to FIG. 1.

An electron gun 101 constitutes an irradiation optical system for irradiating a test piece 118 with a primary electron beam 103 and scanning it. Therefore, the electron gun 101 in the first embodiment means a system including all the constituent elements required for electron beam irradiation. Such constituent elements include an electron source which generates an electron beam, and a deflector lens for applying a beam from point to point. A vacuum chamber partition wall 102 separates an area under atmospheric pressure and an area in vacuum. The operation of the electron gun 101, including the electron beam extraction voltage of the electron source and the applied voltage to the deflector lens, is controlled by an electron gun controller 116.

Secondary electrons 105 produced by a test piece 118 under test as the result of irradiation of the primary electron beam 103 are detected by a secondary electron detector 104. The secondary electron detector is constituted as follows: its sensor portion which actually detects electrons is disposed inside the partition wall 102, and its base portion to which a wire for power supply connection and the like are connected is protruded out of the partition wall. Mechanical probes 106 are brought into contact with predetermined areas in a test piece under test, and are held by attachments 107. Probe driving means 108 are for moving the attachments 107 to desired locations, and move the mechanical probes 106 together with the attachments 107 to desired locations.

A test piece 118 to be actually inspected for defect is held on a test piece stage 109. The test piece stage 109 is in turn held on a test piece stage driving means 110. The test piece stage 109 and the test piece stage driving means 110 are collectively designated as DUT stage. The DUT stage and the probe driving means 108 are formed on a large stage 111. The large stage 111 is provided with driving means for movement in the x, y (in-plane), and z (vertical) directions. The large stage 111 is capable of integrally driving the DUT stage and the probe driving means 108. One of the features of the first embodiment is that the DUT stage and the probe driving means 108 are integrally formed on the large stage 111. An important aspect of the spirit of the present invention is as follow: the inspection device is so constituted that a test piece 118 under test and the mechanical probes 106 can be independently and integrally moved. The large stage 111 is in turn disposed on a base 112. Since the large stage 111 is provided with the driving means for movement in the z (vertical) direction, the following advantage is brought: the large stage 111 is moved down in the z direction before the large stage 111 is moved in the x or y direction. Thereby, interference between the test piece 118, mechanical probes 106, or attachments 107 and the tip of the electron gun 101 can be avoided. When the first embodiment is actually used to carry out SEM observation, the following advantage is brought: the large stage 111 is moved up in the z direction, and thereby the working distance between the tip of the electron gun 101 and the test piece 118 can be reduced. As a result, the spatial resolution of SEM can be enhanced. In the first embodiment, the driving means for movement in the z direction is incorporated into the large stage 111. Instead, it may be incorporated into the test piece stage driving means 110 and the probe driving means 108, or all of the large stage 111, test piece driving means 110, and probe driving means 108. In these cases, the same effect is obtained.

A movement measuring element (not shown) may be incorporated into all or any of the large stage 111, test piece stage driving means 110, and probe driving means 108. For the movement measuring element, for example, a linear scale or an encoder can be used. This brings the following advantages: the accuracy of movement of probes, test piece, and stages can be enhanced and quantified. Since the movement can be more accurately measured with the movement measuring elements, CAD navigation can be more accurately carried out.

The test piece stage 109 and the attachments 107 are connected to an electrical characteristics measuring instrument 113. The probes 106 and the attachments 107 are brought into contact with a test piece 118 and detect electrical signals; therefore, they are electrically floated with respect to the other elements than the electrical characteristics measuring instrument 113. The electrical characteristics measuring instrument measures mainly the current/voltage characteristic of a test piece 118 detected by the mechanical probes 106, and computes desired characteristic values from it. Such characteristic values include, for example, the resistance value, current value, and voltage value of points probed by the mechanical probes 106. In case of an analysis of a semiconductor wafer, for example, a semiconductor parameter analyzer is used for the electrical characteristics measuring instrument 113. The reason why the electrical characteristics measuring instrument 113 and the test piece stage 109 are connected with each other is as follows: there are cases where the test piece placement face of the test piece stage 109 is provided with a feed plug for applying current or voltage to test pieces.

The characteristic values obtained as the result of measurement by the electrical characteristics measuring instrument 113 is transmitted to a control computer 114 through a transmission line. The control computer 114 carries out more sophisticated analyses based on the transmitted information. For example, the control computer analyzes measured values and determines whether the point of measurement is defective or normal. The control computer 114 is provided with a storing means 115, such as optical disk, hard disk, or memory, and is capable of storing the measured electrical characteristics. The control computer 114 also plays a role in controlling the operation of the entire defect inspection device. For example, the operation of the electron gun controller 116, secondary electron detector 104, probe driving means 108, DUT stage, and large stage 111 is controlled by the control computer 114. For this purpose, the control computer 114 is provided with the storing means 115 for storing software for controlling connected components, and with an inputting means for the equipment user to input setting parameters. Examples of the inputting means include image displaying means for displaying operating screens and SEM images, keyboard, mouse for moving a pointer on an operating screen. The equipment user uses an appropriate inputting means to input the positional information and magnification information of the target of probe movement and such information as the contrast and brightness of images.

Data (hereafter, referred to as "CAD image data) on the wiring layout of a test piece under test is stored in CAD WS (WorkStation) 117. The WS 117 is provided with an image displaying means for displaying wiring layouts. The CAD WS 117 is connected to the control computer 114, and transmits CAD image data to the control computer 114 as required.

In the first embodiment, the control computer 114 and the CAD WS 117 are constituted as separate computers. Instead, they may be integrated and constituted as a single computer. In addition, the electron gun controller 116 may also be integrated and the three units may be constituted as a single computer.

Next, description will be given to the operation of the defect inspection device illustrated in FIG. 1, referring to FIG. 2A to FIG. 2D. When started, the device is brought into a state in which the device waits for the magnification of SEM image to be set. Then, the displaying screen accompanying the control computer 114 displays a means for inputting the setting of magnification (Step 201). Examples of the means for inputting the setting of magnification include inputting means based on icons or GUI. The equipment user inputs a magnification of SEM through the inputting means. The equipment user does not know where the probes 106 are located on the large stage 111. Therefore, at Step 201, the equipment user usually inputs the lowest magnification of the SEM. When the tips of the probes are congregated in the relatively central area in the SEM field of view, a low magnification is acceptable. The low magnification here referred to is usually a magnification not higher than 300 times. The controlling means 114 adjusts the conditions of the electron gun 101 based on the inputted values, acquires a SEM image at the inputted magnification, and displays the image on the displaying means (Step 202).

The equipment user visually checks whether the target location of measurement on the test piece is embraced in the acquired SEM image or not (Step 203). If not, the equipment user drives the large stage 111 to move the test piece stage 109 into the field of view embracing the SEM image (Step 204). Instead of moving the large stage 111, the equipment user may move the DUT stage itself to move the point of inspection into the field of view embracing the SEM image. At Step 204, the point of inspection indicated over the SEM image can look like a dot at the most depending on the size of the point of inspection. After confirming that the point of inspection is located in the field of view embracing the SEM image, the equipment user visually checks in turn the following: whether probes to be used in inspection on the test piece are located in the field of view embracing the SEM image or not (Step 205). If the probes are located in the field of view, the operation proceeds to Step 207. If not, the equipment user drives the probe driving means 108 to move all the probes to be used in inspection into the field of view embracing the SEM image (Step 206). In this case, all the probes to be used in inspection are moved into the SEM field of view at Step 205 and Step 206. However, at least one of the probes only has to be located in the field of view in some cases. Examples of such cases include: a case wherein it has been already known that the tips of all the probes to be used are located in proximity to one probe observed within the SEM field of view, for example, a case where inspection according to the present invention has been already carried out elsewhere on the test piece. This is the same with the following steps of the inspection.

After it has been confirmed that all the probes to be used are located in the field of view embracing the SEM image, the operation is performed at the following steps for displaying the SEM image at changed magnification. First, the equipment user inputs a magnification of SEM (Step 207). As a means for inputting a magnification, the equipment user uses the inputting means displayed at Step 201 without change. To initiate probing operation, usually, a higher value of magnification than inputted at Step 201 is inputted to the inspection device at Step 207. The control computer 114 adjusts the electron gun 101 and the secondary electron detector 104 according to the inputted magnification, and acquires a SEM image at the inputted magnification (Step 208).

Thus, the image in which the area that looked like only a dot in the initial SEM image at low magnification is displayed in magnified form. Therefore, the equipment user must carry out probing on the point of inspection on the test piece in the SEM image at high magnification. Or, since a SEM image at high magnification is acquired, the point of inspection which was originally located within the field of view embracing the SEM image at low magnification can get out of the field of view embracing the SEM image at the completion of Step 208. In some cases, probes also disappear from the field of view embracing the SEM image. Consequently, it becomes necessary to identify the location of inspection and carry out probe navigation. Therefore, description will be given below to the flow of identifying the location of inspection and the flow of probe navigation using CAD.

When a SEM image at high magnification is acquired, the control computer 114 transmits a request for CAD image data of the point corresponding the displayed SEM image to the CAD WS 117 (Step 209). The CAD WS 117 transfers the requested CAD image data to the control computer 114 (Step 210). The control computer 114 displays the CAD image on the displaying screen. In addition, the control computer 114 displays on the displaying screen a prompt to input a reference point for bringing CAD image and SEM image into correspondence with each other (Step 211). The equipment user inputs a reference point for correspondence between CAD image and SEM image to the control computer 114 through the inputting means accompanying the control computer 114. Possible methods for inputting a reference point include clicking the pointer on some point on the CAD image and some point on the SEM image. The control computer 114 links the CAD image and the SEM image to each other based on the coordinate information (positional information) of the inputted reference point (Step 212). At the same time, the control computer 114 also links the respective magnification information.

After the link is provided between the CAD image and the SEM image at Step 212, the CAD WS 117 is brought into a state in which it waits for the input of the positional information of the point of inspection, that is, probing position, on the CAD image. For example, icons for inputting probing positions are displayed on the screen, or a message prompting input is displayed on the screen (Step 213). When the equipment user specifies probing positions, the CAD WS 117 transmits the coordinate information of the inputted probing positions to the control computer 117 (Step 214). The control computer 114 converts the coordinate information of the probing positions, transmitted from the CAD WS 117, into coordinate information with respect to the SEM image (Step 215).

The operation of Step 215 can be implemented because the link of coordinate information was established between the SEM image and the CAD image at Step 211 and Step 212. Further, the control computer 114 computes the movement of the DUT stage from the positional information of the probing positions with respect to the obtained SEM image and the present positional information of the DUT stage (Step 216). The present positional information of the DUT stage can be computed based on the coordinates of the reference position in the SEM image, specified by the equipment user at Step 212. After the completion of computation, the control computer 114 moves the DUT stage by the computed amount. Thereby, the control computer 114 moves the points specified in the CAD image into the field of view embracing the SEM image at high magnification (SEM image obtained at Step 208) (Step 217).

By carrying out the above-mentioned steps, the following can be implemented when the magnification of the SEM image is increased: target probing positions can be automatically moved into the field of view embracing the SEM image, and thus the effort that must be otherwise made by the equipment user can be reduced.

At Step 218, the equipment user visually checks whether the probing positions are embraced in the displayed SEM image. If not, the equipment user drives the DUT stage so that the probing positions will come into the SEM field of view (Step 220). As the result of the operation of Step 217, the probing positions must have moved to the vicinity of the field of view embracing the presently visible SEM image. Therefore, even if the equipment user searches for probing positions by him/herself, a burden on the equipment user can be lessened as compared with conventional cases. When the operation of Step 220 is performed, the field of view embracing the SEM image is changed. Therefore, the CAD image must also be changed; however, the CAD image is automatically updated by the inspection device.

The control computer 114 already holds the information of link between the coordinates in the SEM image and those in the CAD image. Therefore, the control computer 114 computes the movement and direction of movement of the DUT stage, moved through the operation by the equipment user. Then, the control computer 114 requests the CAD WS 117 to transmit CAD data corresponding to the coordinates of the SEM image presently displayed. The CAD WS 117 selects appropriate CAD data based on the coordinate information of CAD data, transmitted from the control computer 114, and transfers it to the control computer 114 (Step 221). The control computer 114 displays the transmitted CAD data on the displaying screen in the form of image, and completes the operation of updating the CAD image (Step 222).

As mentioned above, the defect inspection device of the first embodiment is provided with a function of updating the displayed CAD image in accordance with change in the field of view embracing the SEM image. With the defect inspection device of the first embodiment, therefore, a burden on the equipment user is significantly lessened during probing.

If the probing positions are embraced in the field of view embracing the SEM image, next, the equipment user checks whether all the probes to be used in inspection are located in the field of view embracing the SEM image or not (Step 219). In the first embodiment, the operation of Step 219 is also visually checked by the equipment user. If all the probes are located in the field of view embracing the SEM image, the operation proceeds to Step 223. If not, the equipment user operates the probe driving means 108 so that the tips of all the probes to be used will come into the field of view embracing the SEM image (Step 224). There are cases where only one mechanical probe 106 is used in defect inspection, but a plurality of probes are often required. Some examples will be taken. If voltage is applied though a feed plug, the contact resistance of a point of probing can be inspected by bringing a probe into contact only with the point. However, to examine I/V characteristics or the like, at least two mechanical probes are required, and to examine the characteristics of a transistor, at least three probes are required.

In FIG. 1, the defect inspection device of the first embodiment looks to use only two mechanical probes 106. In actuality, however, more than two mechanical probes are used. To switch from a SEM image at low magnification to a SEM image at high magnification in stages, the following procedure is taken: at the completion of the processing of Step 219, the magnification of the SEM image is changed, and the operation goes back to Step 218 and the same processing is performed again. In this case as well, the displayed CAD image is automatically updated to the magnification of the SEM image.

When all the probes to be used are positioned in the field of view embracing the SEM image, the displaying screen of the control computer 114 shows the SEM image and the CAD image in superimposition (Step 223). Viewing the displayed SEM image and CAD image, the equipment user moves the mechanical probes 106, and brings the probes into contact with points of inspection. When all the probes are brought into contact, the measurement of the electrical characteristics of the points of probing can be started (Step 225).

Figure 2A:
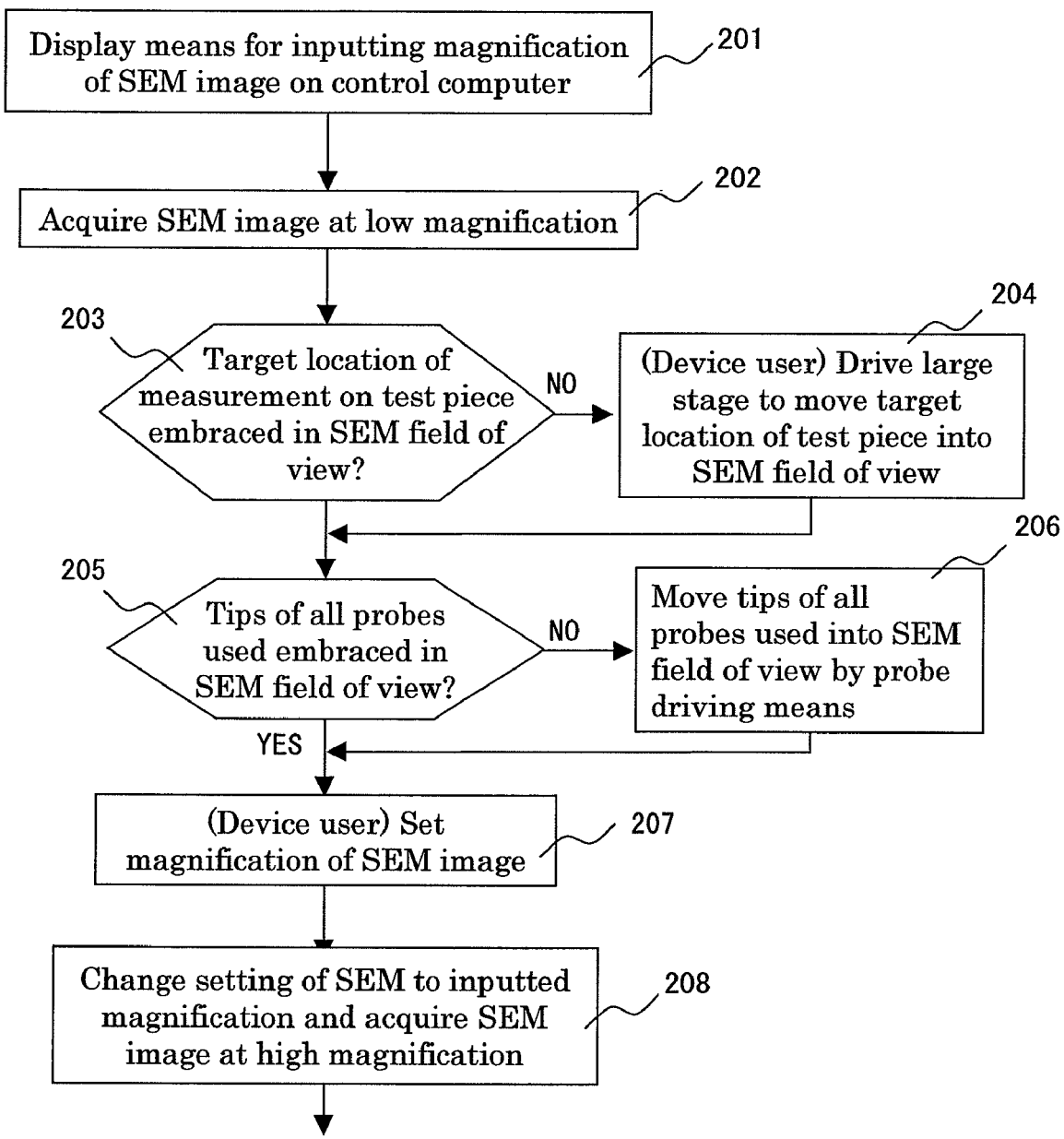
FIG. 2A is a flowchart illustrating part of the basic flow of the probing operation using the defect inspection device illustrated in FIG. 1.
Figure 2B:
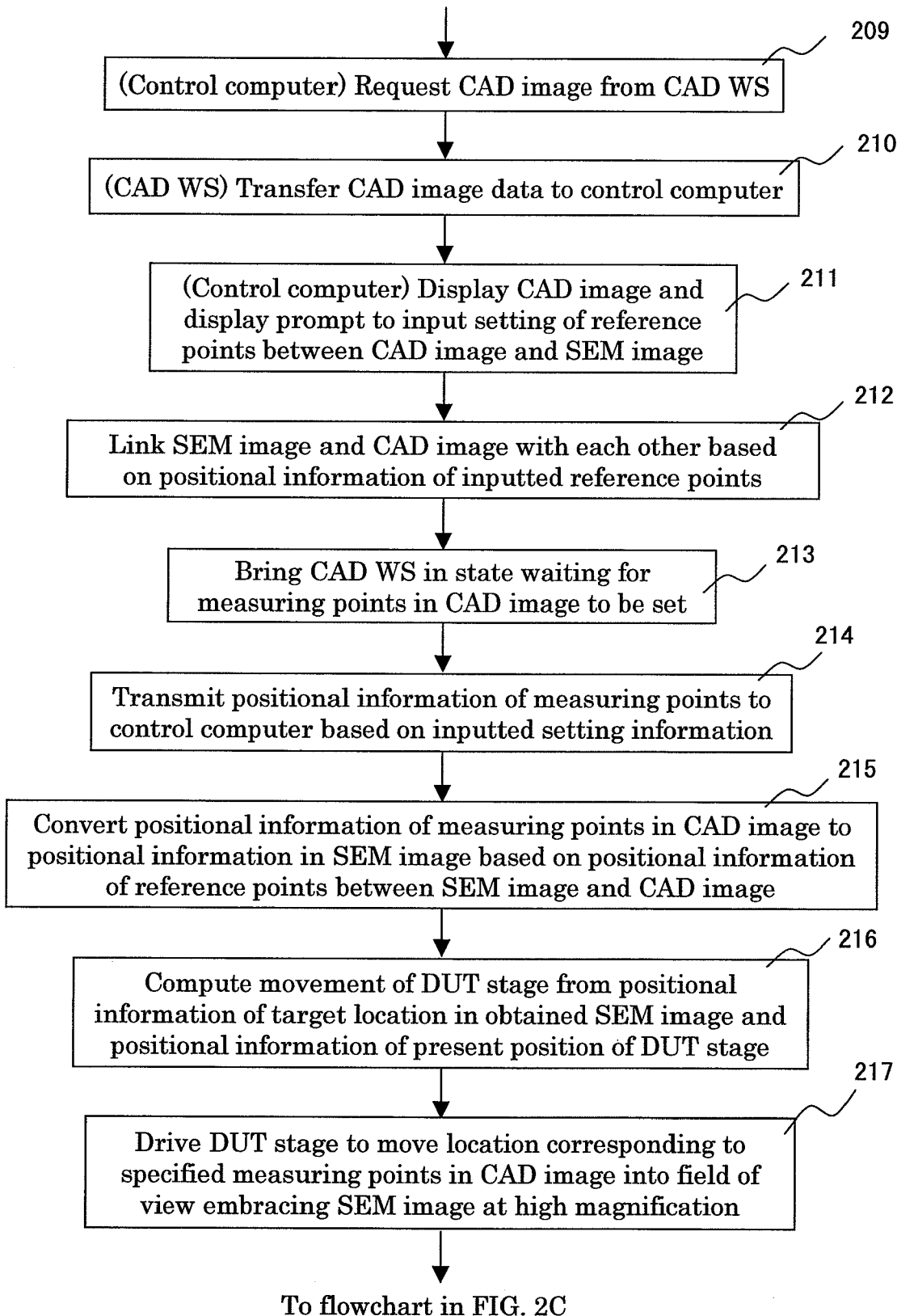
FIG. 2B is a flowchart illustrating part of the basic flow of the probing operation using the defect inspection device illustrated in FIG. 1, subsequent to the flowchart in FIG. 2A.
Figure 2C:
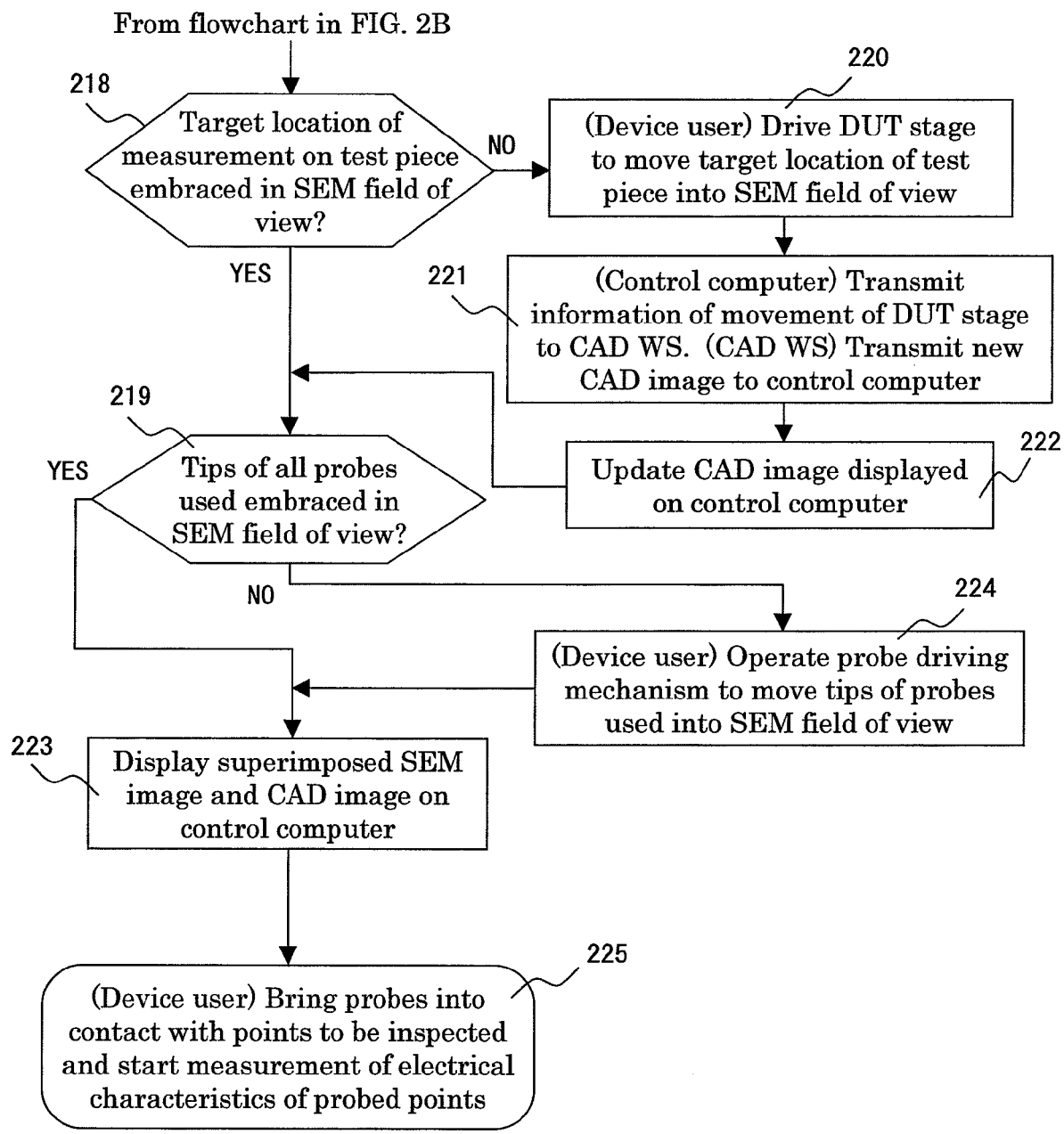
FIG. 2C is a flowchart illustrating part of the basic flow of the probing operation using the defect inspection device illustrated in FIG. 1, subsequent to the flowchart in FIG. 2B.
Figure 2D:
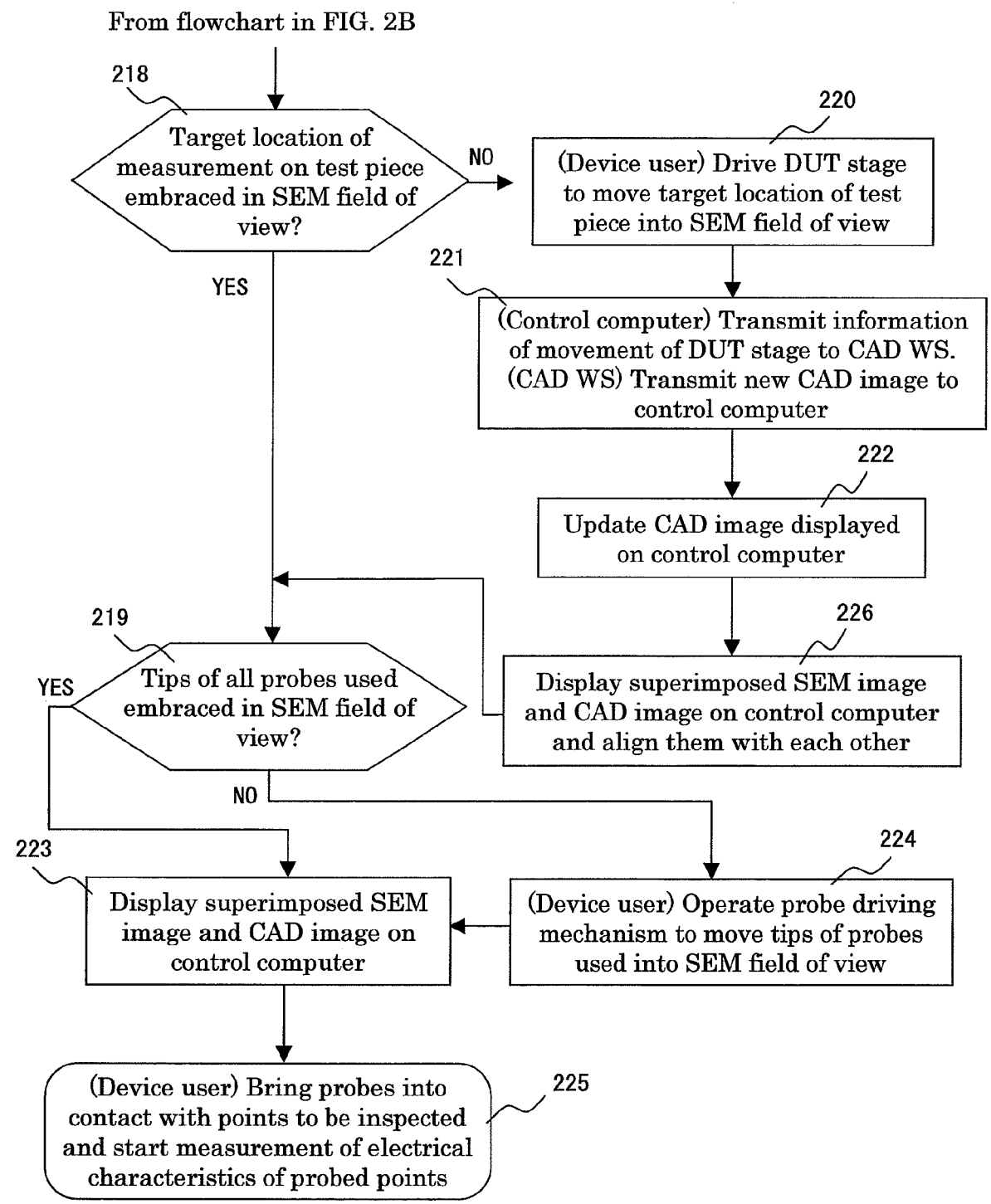
FIG. 2D is a flowchart illustrating part of the basic flow of the probing operation using the defect inspection device illustrated in FIG. 1, subsequent to the flowchart in FIG. 2C.

As mentioned above, the SEM image and the CAD image are displayed in superimposition at Step 223. However, there can be misalignment between the SEM image and the CAD image because of the machine accuracy of the DUT stage. A method for eliminating this misalignment will be described referring to FIG. 2D. Following Step 222, the control computer 114 displays the SEM image and the CAD image in superimposition. If there is misalignment at this time, the misalignment can be corrected by the equipment user (Step 226). The concrete procedure for misalignment correction is the same as Step 211 and Step 212 in FIG. 2B. In this case, however, the magnification is higher than in Step 211 and Step 212; therefore, the positional misalignment can be more accurately corrected. More specific description will be given. The control computer 114 displays on the displaying screen a prompt to input a reference point for bringing the SEM image and the CAD image into correspondence with each other. The equipment user inputs a reference point for correspondence between the SEM image and the CAD image to the control computer 114 by the inputting means accompanying the control computer 114. Possible methods for inputting a reference point include clicking the pointer on some point on the SEM image and some point on the CAD image. The control computer 114 corrects the misalignment between the SEM image and the CAD image based on the coordinate information (positional information) of the inputted reference point. At the same time, the control computer 114 may also update the respective link information associated with magnification information. In FIG. 2D, Step 226 is placed next to Step 222. Instead, Step 226 may be placed next to Step 223.

The foregoing is a description of the basic flow of probing used when inspection is carried out using the inspection device illustrated in FIG. 1. To change a probing position, the processing of FIGS. 2A to 2D need not be performed again from the beginning. The equipment user drives the DUT stage, and thereby brings the probing position into the field of view embracing the SEM image. Only the test piece can be moved independently of the probes by driving the DUT stage. Therefore, the point of inspection can be moved with the correlation maintained between the tips of the mechanical probes 106 and the primary electron beam 103. Thus, provision of the test piece stage driving means 110 illustrated in FIG. 1 obviates necessity for performing the processing of FIGS. 2A to 2D again from the beginning. The equipment users' convenience is dramatically enhanced as compared with conventional charged particle beam systems.

Of the flows illustrated in FIGS. 2A to 2D, the information of the steps carried out by the inspection device is all stored in the storing means 115 of the inspection device, illustrated in FIG. 1, as software for sequence control.

Figure 3:
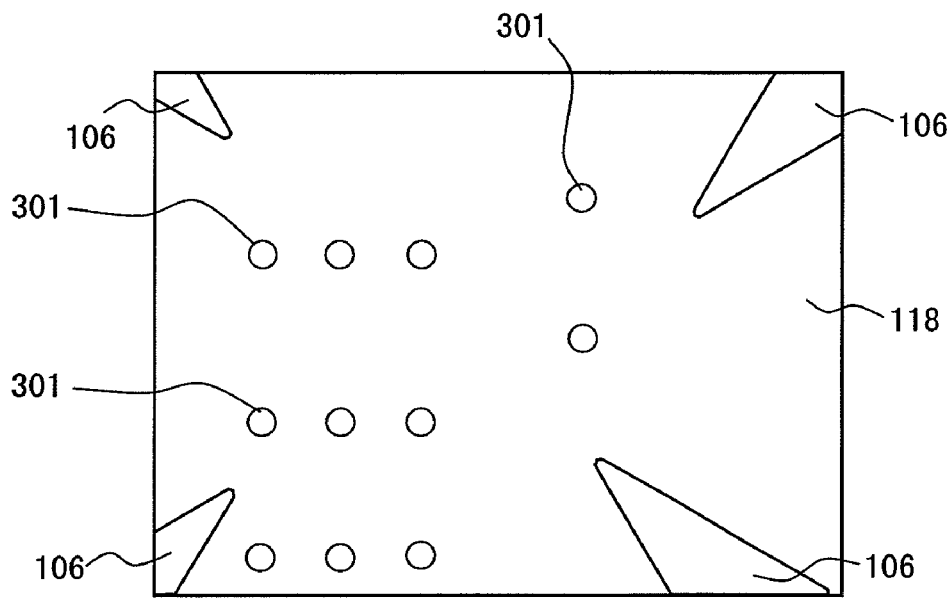
FIG. 3 is a drawing illustrating examples of a SEM image at high magnification and a CAD image at high magnification displayed on the device illustrated in FIG. 1.
Figure 3:
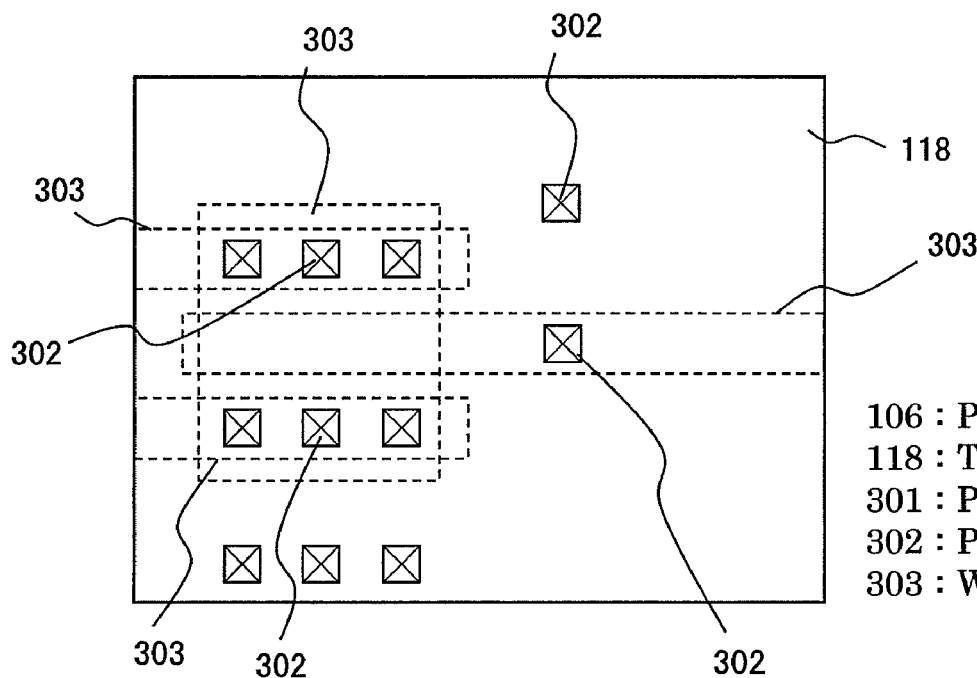

Item (a) of FIG. 3 illustrates an example of a SEM image at high magnification, and Item (b) of FIG. 3 illustrates an example of the CAD image of the point corresponding to the SEM image under Item (a) of FIG. 3. The drawing under Item (a) of FIG. 3 shows the tips of four mechanical probes 106, a semiconductor wafer 118 as a test piece, plugs 301 which appear in the wiring pattern formed on the wafer. The image illustrated under Item (a) of FIG. 3 corresponds to the SEM image displayed on the displaying screen of the control computer 114 when Step 219 in the processing illustrated in FIG. 2C is completed. If all the probes are originally located in the field of view embracing the SEM image at high magnification, the same SEM image is also displayed at the completion of Step 208.

The drawing under Item (b) of FIG. 3 illustrates the layout of the wiring pattern on the wafer which cannot be observed in the SEM image in reality. The drawing includes a wafer 118 and plugs 302 which correspond to the plugs 301 in the drawing under Item (a) of FIG. 3. The areas encircled with dotted lines indicate that wiring 303 is formed there. The wiring 303 is completely invisible in the SEM image under Item (a) of FIG. 3. Therefore, if a defect is, for example, a break in the wiring 303, the following procedure must be taken in conventional inspection equipment which does not display CAD images: a skilled equipment user determines the probing position while moving the CAD image in accordance with the movement of the field of view embracing the SEM image. Meanwhile, in this embodiment, the SEM image at high magnification and the CAD image are displayed together on the control computer screen, as illustrated under Item (b) of FIG. 3. Therefore, the equipment users' convenience during probing is dramatically enhanced as compared with conventional cases.

Figure 4:
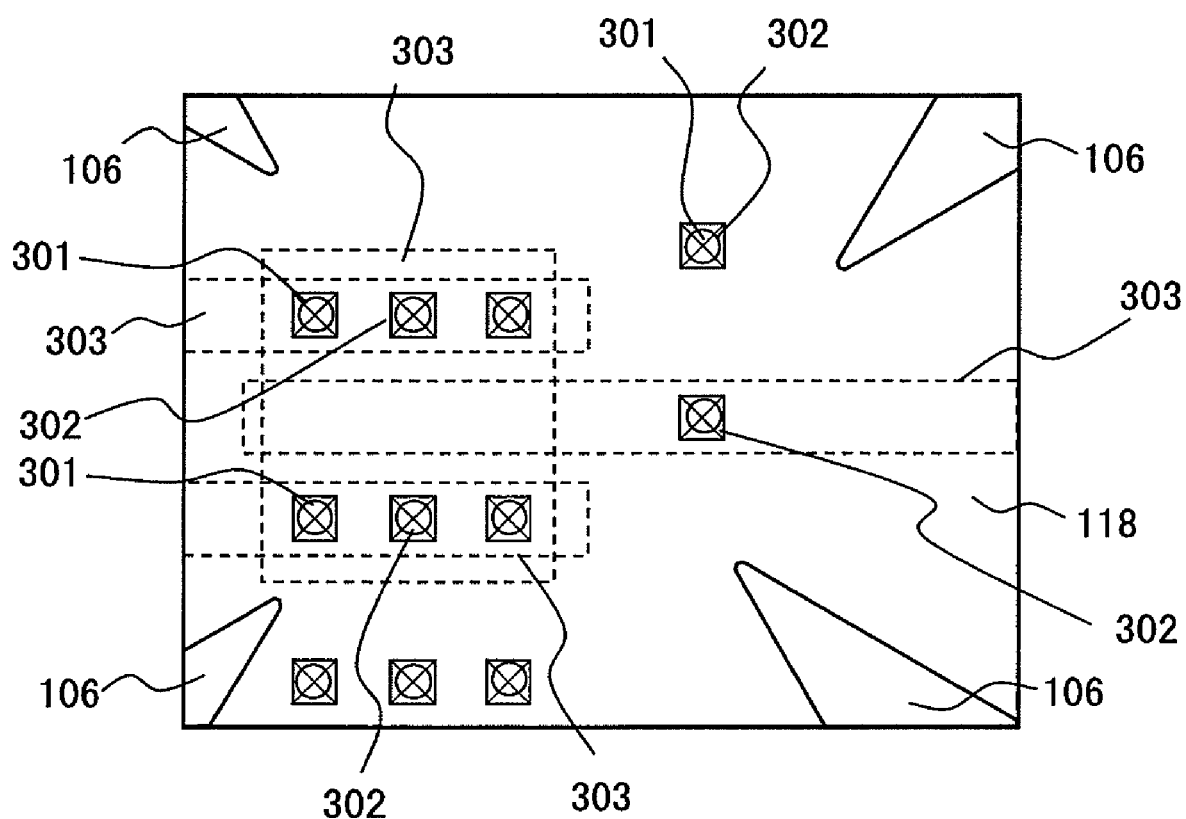
FIG. 4 is a drawing illustrating the SEM image at high magnification and the CAD image at high magnification illustrated in FIG. 3 when they are superimposed.

FIG. 4 illustrates the way a SEM image at high magnification and a CAD image are displayed in superimposition. This image corresponds to the image displayed on the control computer screen when Step 223 in the flow illustrated in FIG. 2C is completed. Displaying the CAD image and the SEM image in superimposition further enhances the equipment users' convenience when the user finally brings the probes into contact.

Figure 5A:
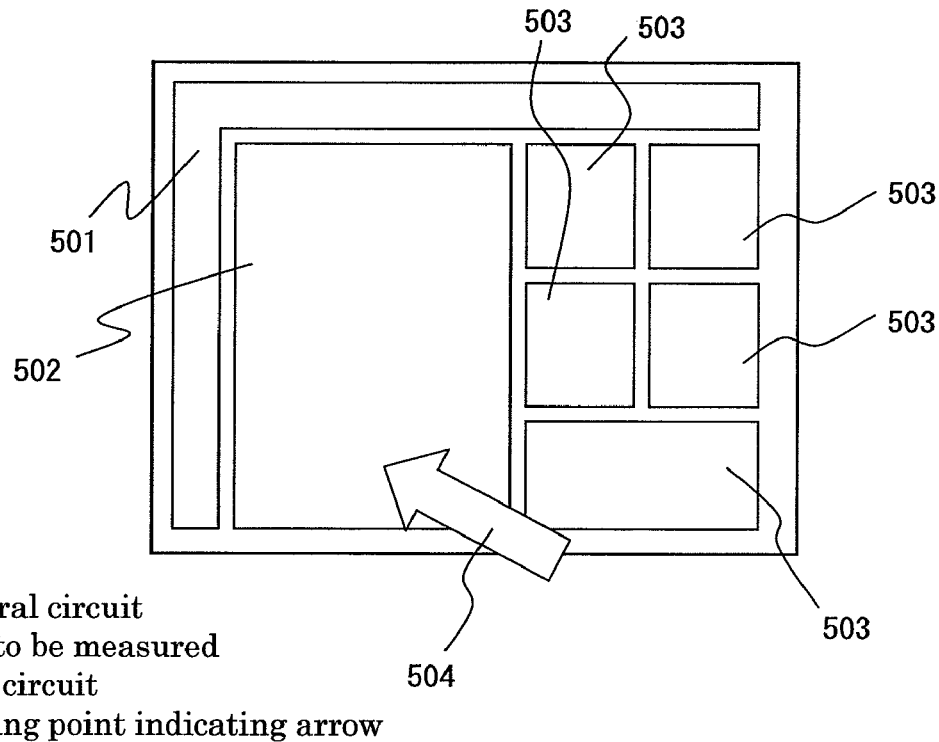
FIGS. 5A and 5B are drawings illustrating an example in which the area corresponding to a CAD image at high magnification is indicated by an arrow in a CAD image at low magnification.
Figure 5B:
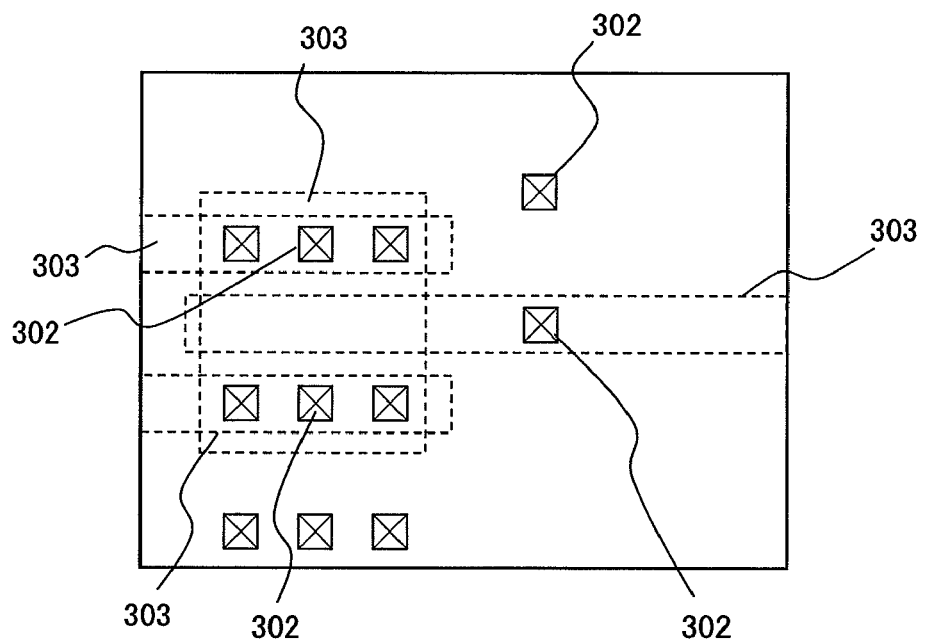

FIGS. 5A and 5B illustrate an example in which a CAD image at low magnification and a CAD image at high magnification are displayed together on the control computer 114 screen. FIG. 5A illustrates a CAD image at low magnification. It may be considered as a CAD image embracing the area substantially corresponding to the field of view embracing the SEM image at the lowest magnification set at Step 202 in FIG. 2A. The CAD image at high magnification illustrated in FIG. 5B may be considered as a CAD image embracing the area corresponding to the field of view embracing the SEM image acquired at Step 208 in FIG. 2A. A CAD image at such a level of magnification as illustrated in FIG. 5A shows an overall view of the wiring layout on a wafer. In FIG. 5A, for example, a circuit 502 to be measured as well as a peripheral circuit 501 and related circuits 503 are displayed on the screen.

In a CAD image on the scale illustrated in FIG. 5A, a CAD image on the scale illustrated in FIG. 5B only looks like a dot. Consequently, an arrow 504 indicating the area illustrated in FIG. 5B is displayed over the CAD image at low magnification (wide-area CAD image). Thus, the equipment users' convenience is enhanced when the user manually moves probes. This function is used, for example, when after the completion of manual probing of Step 225 in FIG. 2D, the user moves the SEM image to the next point of inspection. More specific description will be given. When the movement to the next point of inspection is great, for example, the following operation is performed: the magnification of the SEM image is once lowered to display a SEM image at low magnification, and the large stage is driven. In this case, a wide-area CAD image including the area illustrated in FIG. 5B, or the target position is called up from the CAD WS 117, and is displayed on the control computer 114.

The arrow 504 is displayed over the wide-area CAD image. Therefore, the equipment user manually operates the large stage or the DUT stage, aiming at the dot indicated by the arrow. Thereby, the equipment user brings the point of inspection into the field of view embracing the SEM image at low magnification. As long as the link is established between the SEM image and the CAD image, the arrow 504 may be displayed in combination with the SEM image at low magnification. What is marked with reference numeral 504 is not limited to arrow, and it may be constituted in any manner, including pointer and icon, as long as it is a means for indicating the area including the point of inspection. To make it possible to call up wide-area CAD images from the CAD WS 117, a means for calling up wide-area CAD images only has to be displayed on the displaying means of the control computer 114. Possible means for calling up the images include an icon indicating wide-area CAD image.

Second Embodiment

Figure 6:
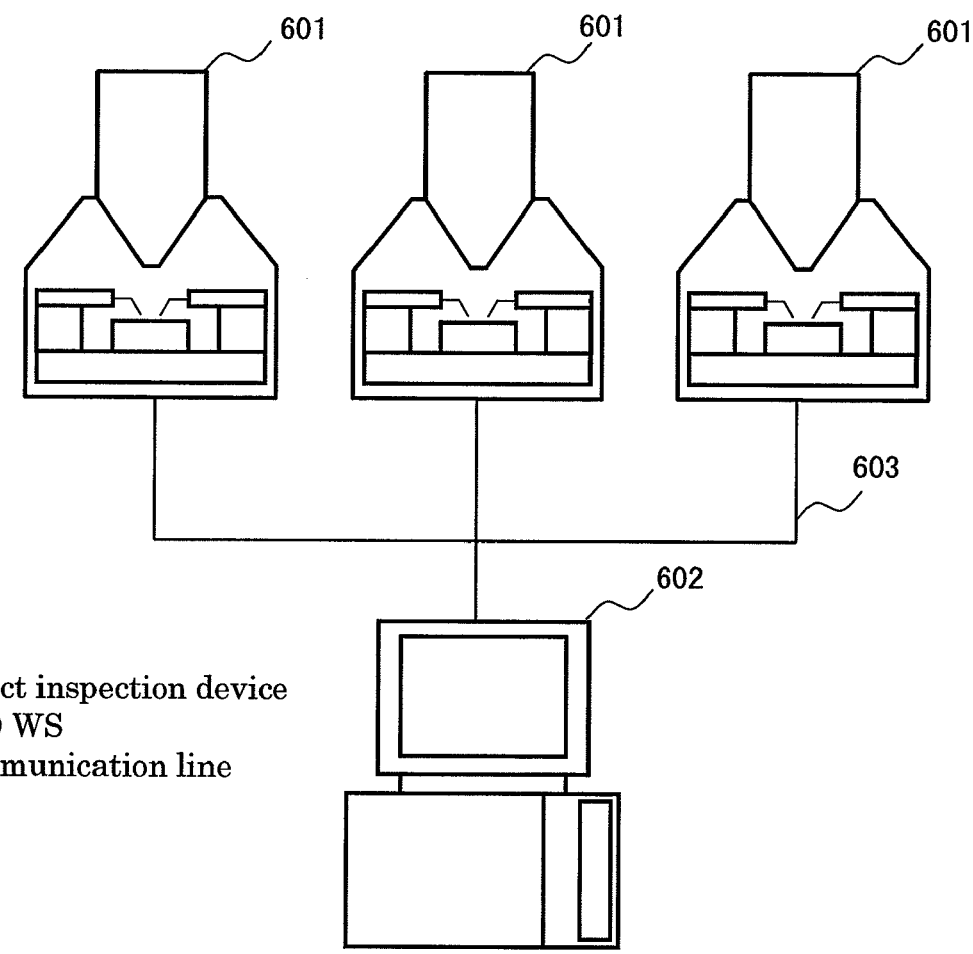
FIG. 6 is a drawing illustrating an example of a defect inspection system in which one CAD WS is shared among a plurality of defect inspection devices.

Description will be given to a second embodiment which involves a defect inspection system so constituted that CAD WS is shared among a plurality of defect inspection devices or failure analyzers. FIG. 6 schematically illustrates a defect inspection system. A plurality of (three) defect inspection devices 601 are connected to CAD WS 602 through communication lines 603. The second embodiment is on the assumption that the internal structure of the three defect inspection devices is the same as the defect inspection device illustrated in FIG. 1. However, any other equipment may be used for this purpose. The three units may be constituted as a combined defect analyzing system comprising a defect inspection device and a failure analyzer. For example, the following combination is acceptable: one of the three units is a defect inspection device illustrated in FIG. 1, and the other two units are a focused ion beam system and a transmission electron microscope. In case of the combined defect analyzing system in the second embodiment, the three units are independent vacuum systems. Respective vacuum devices are connected to the three units, and these vacuum devices are connected to one another through vacuum transport systems (not shown). In this case, test pieces can be transported between the devices without being exposed to the atmospheric air. This produces the effect of reducing the influence of test piece contamination in the air.

The CAD WS 602 is a device which stores all the wiring layouts formed on test pieces under test, and is very expensive. Therefore, one CAD WS 602 is shared, as illustrated in FIG. 6, and thereby the cost incurred when the system is built can be reduced. Further, the scale of the system can be increased only by adding a defect inspection device one by one. Therefore, this is a constitution highly effective in ensuring the scalability of the defect inspection system.

Third Embodiment

Figure 7:
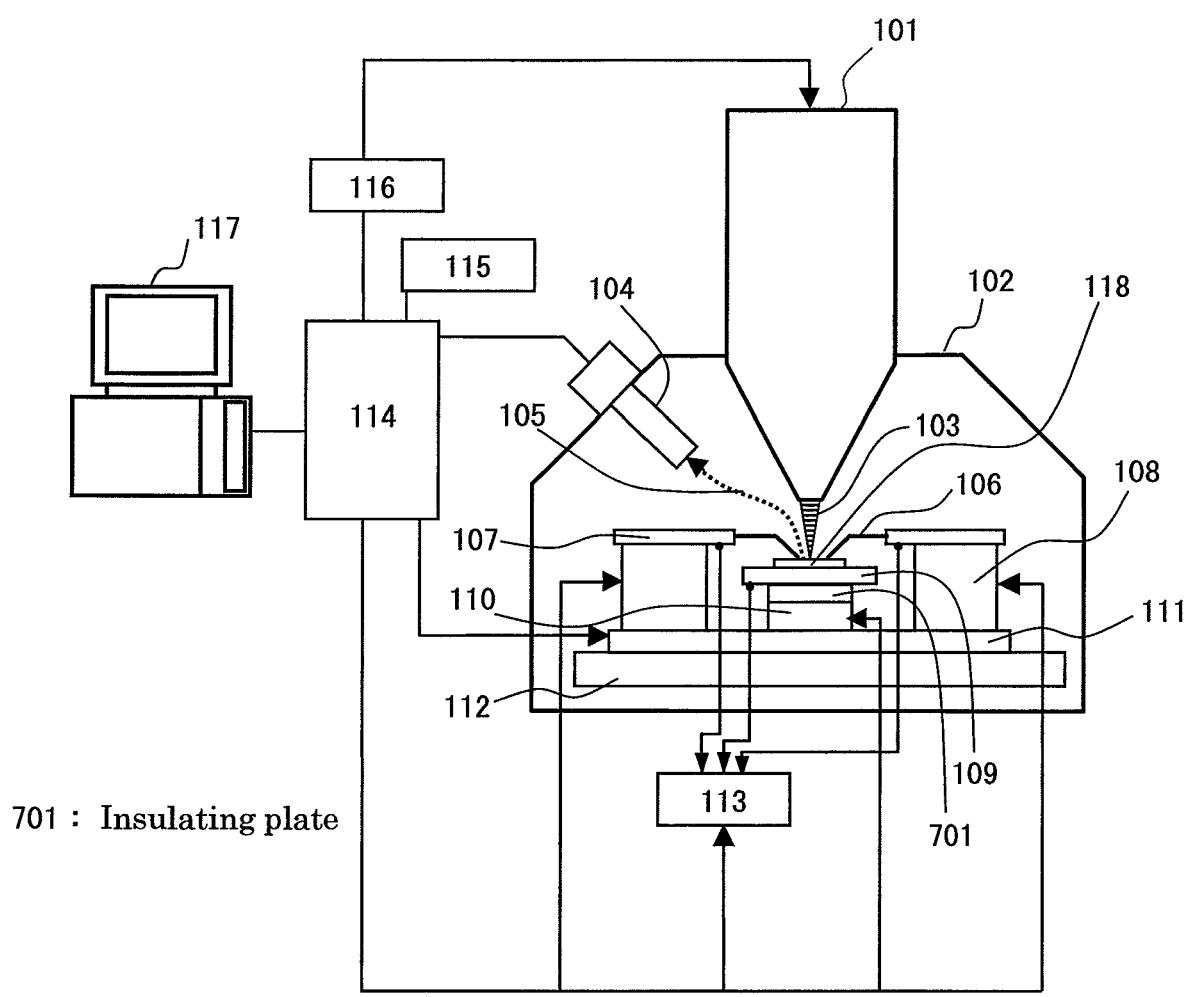
FIG. 7 is a drawing illustrating another example of the configuration of a defect inspection device.

Description will be given to a third embodiment. This is another example of the defect inspection device in which mechanical probes for electrical characteristics evaluation are mounted inside the test piece chamber of SEM. FIG. 7 illustrates an example of the configuration of a defect inspection device in which the probe navigation method of the third embodiment is carried out. This configuration is substantially the same as the configuration of the defect inspection device of the first embodiment, illustrated in FIG. 1. Therefore, description will be given only to a difference between them.

The difference between the device in FIG. 1 and that in FIG. 7 is the presence of an insulating plate 701. The insulating plate 701 is mounted so that it is sandwiched between the test piece stage 109 and the test piece stage driving means 110. Thus, test pieces are electrically insulated from the vacuum chamber partition wall 102, test piece stage driving means 110, and the like.

This constitution enables an EBAC (Electron Beam Absorption Current) method for inspecting fine wiring formed on a test piece 118 for faulty electrical continuity.

The test piece stage 109 and the attachments 107 are connected to the electrical characteristics measuring instrument 113. The electrical characteristics measuring instrument 113 measures mainly the absorption current at the test piece 118 detected by the probes 106.

For analyses of faulty electrical continuity in the wiring of semiconductor devices, for example, a high sensitivity current detector is used as the electrical characteristics measuring instrument 113. The reason why the electrical characteristics measuring instrument 113 and the test piece stage 109 are connected with each other is as follows: there are cases where the test piece placement face of the test piece stage 109 is provided with a feed plug for applying current or voltage to test pieces 118.

The value of absorption current measured by the electrical characteristics measuring instrument 113 is transmitted to the control computer 114 through a transmission line. The control computer 114 takes this value as a luminance signal, and produces a display on the monitor screen of the control computer 114 in synchronization with the scanning cycle of the primary electron beam 103 of SEM. Thereby, the control computer 114 can form EBAC (Electron Beam Absorption Current) images embraced in the same field of view as SEM images are embraced.

Next, description will be given to EBAC image acquisition with the constitution of the third embodiment and a method for estimating the location of a break based thereon. The description will be given referring to FIG. 7 and FIG. 8.

Figure 8:
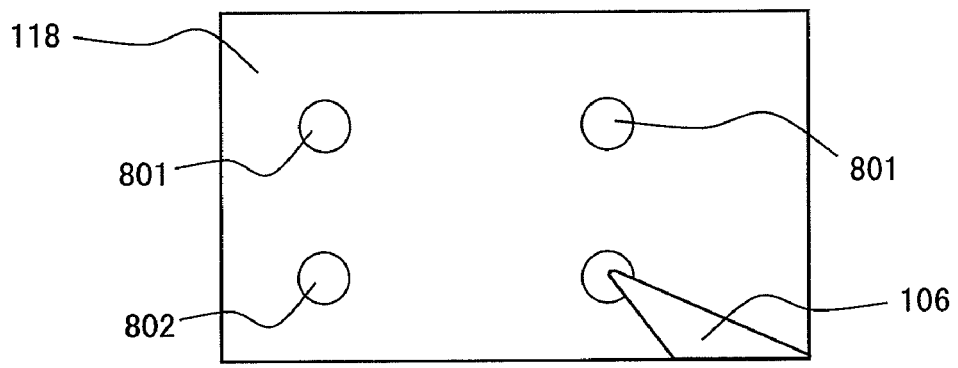
FIG. 8 is a drawing illustrating examples of a SEM image, EBAC image, and CAD image displayed on the device illustrated in FIG. 7.
Figure 8:
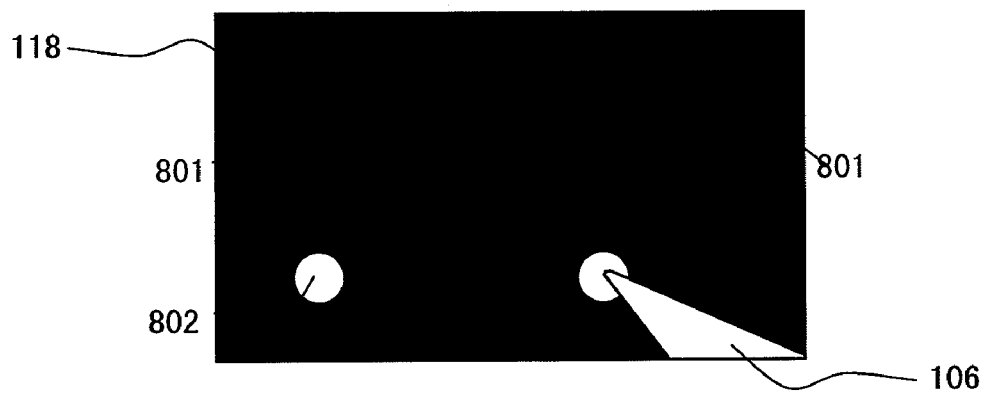
Figure 8:
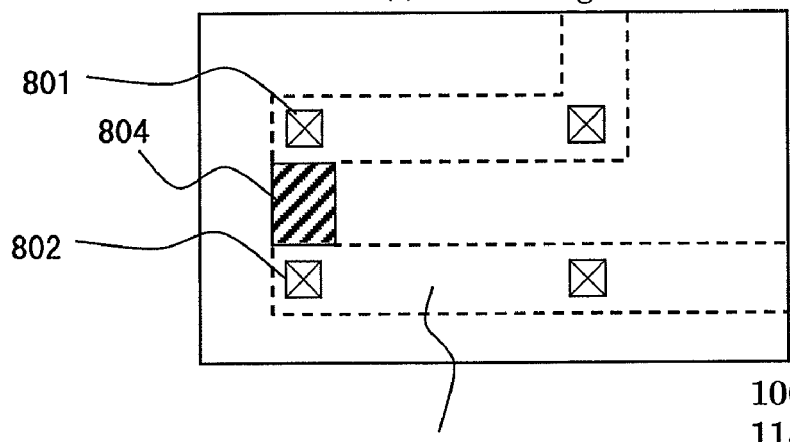

As an example, it is assumed that fine wiring is installed in a test piece 118, and a plurality of metal plugs connected to this wiring are exposed at the surface of the test piece 118. When this is observed under an ordinary SEM, the SEM image illustrated under Item (a) of FIG. 8 is obtained. At this time, the CAD image corresponding to the SEM image area illustrated under Item (a) of FIG. 8 is obtained, as illustrated under Item (c) of FIG. 8. At this time, the method described in detail in connection with the first embodiment is used. Based on this CAD image information, the probe 106 is brought into contact with an arbitrary plug. In this state, the primary electron beam 103 emitted from the electron gun 101 is applied to the surface of the test piece 118 from point to point. Usually, the intensity of the secondary electrons 105 emitted at this time is taken as a luminance signal, and a display is produced on the screen in synchronization with the scanning cycle of the primary electron beam 103. Displayed is the SEM image illustrated under Item (a) of FIG. 8. In the third embodiment, the value of absorption current at the test piece 118 detected by the probe 106 is taken as a luminance signal in place of the intensity of secondary electrons. Thereby, the EBAC image illustrated under Item (b) of FIG. 8 is obtained. If a break 804 exists in the internal wiring 803 connecting the plug 801 and the plug 802 at this time, the absorption current absorbed at the plugs 801 is not detected by the probe 106. Therefore, the plugs 801 are not displayed in the EBAC image. In the image illustrated under Item (b) of FIG. 8, the plugs 801 are indicated by white dotted-line circle to indicate their positions. In reality, however, nothing is observed in the EBAC image. The absorption current absorbed at the plug 802 is detected by the probe 106, and thus it is brightly displayed in the EBAC image. The internal wiring 803 is not seen at all in the SEM image illustrated under Item (a) of FIG. 8. Therefore, if defect is the break 804 in the internal wiring 803, for example, the following procedure must be taken with conventional inspection equipment which does not display CAD images: a skilled equipment user determines the position of probing while moving the CAD image in accordance with the movement of the fields of view embracing the SEM image and the EBAC image, and estimates the location of the break. Meanwhile, in this embodiment, the SEM image, EBAC image, and CAD image are displayed together on the control computer screen, as illustrated under Item (c) of FIG. 8. Thereby, the equipment users' convenience during probing is dramatically enhanced as compared with conventional cases.

The defect inspection device of the third embodiment is provided with a function of updating the displayed CAD image in accordance with change in the fields of view embracing the SEM image and the EBAC image. This updating is carried out by the same method as described in detail in connection with the first embodiment. Therefore, with the defect inspection device of the third embodiment, a burden on the equipment user is significantly lessened during probing.

The value of absorption current measured by the probes 106 or the test piece stage 109 in the third embodiment is often very small. For this reason, detected signals can be influenced and deteriorated by noise. In this case, the following procedure can be taken instead of connecting the test piece stage 109 and the attachments 107 directly to the electrical characteristics measuring instrument 113: a preamplifier (not shown) is placed in the wiring between the test piece stage 109 and the attachments 107, and the electrical characteristics measuring instrument 113 in proximity to the test piece 106 as much as possible. Then, microcurrent detected by the probes 106 or the test piece stage 109 is amplified into a voltage signal, and then transmitted to the electrical characteristics measuring instrument 113. Thus, the influence of the noise of microcurrent can be reduced.

In the third embodiment, there are cases where only one probe 106 is used in defect inspection. There are cases where a plurality of probes are required as in the first embodiment. For example, when a plurality of pieces of wiring are inspected for break or on like occasions, these pieces of wiring can be inspected at a time by probing a plurality of plugs.

In FIG. 7, the defect inspection device of the third embodiment looks to use only two mechanical probes 106. In actuality, however, more than two probes are used sometimes.

In the third embodiment as in the first embodiment, the SEM image and the CAD image or the EBAC image and the CAD image can be displayed in superimposition (not shown). Thereby, the equipment users' convenience is further enhanced when the user finally manually brings probes into contact and estimates the location of a break.

In the third embodiment as in the first embodiment, an arrow indicating an area can be displayed over the CAD image at low magnification (not shown). Thereby, the equipment users' convenience can be enhanced when the user manually moves the probes.

In the third embodiment, SEM images and EBAC images can be obtained. These images can be displayed on the image displaying means provided to the control computer 114. At this time, the operating screen of the image displaying means provided to the control computer 114 can display all or any of the SEM image, EBAC image, and CAD image. If the operating screen is provided with icons for changing the screens, various types of display can be implemented. For example, arbitrary images can be selectively displayed, all displayed, or displayed in superimposition.

Fourth Embodiment

Figure 9A:
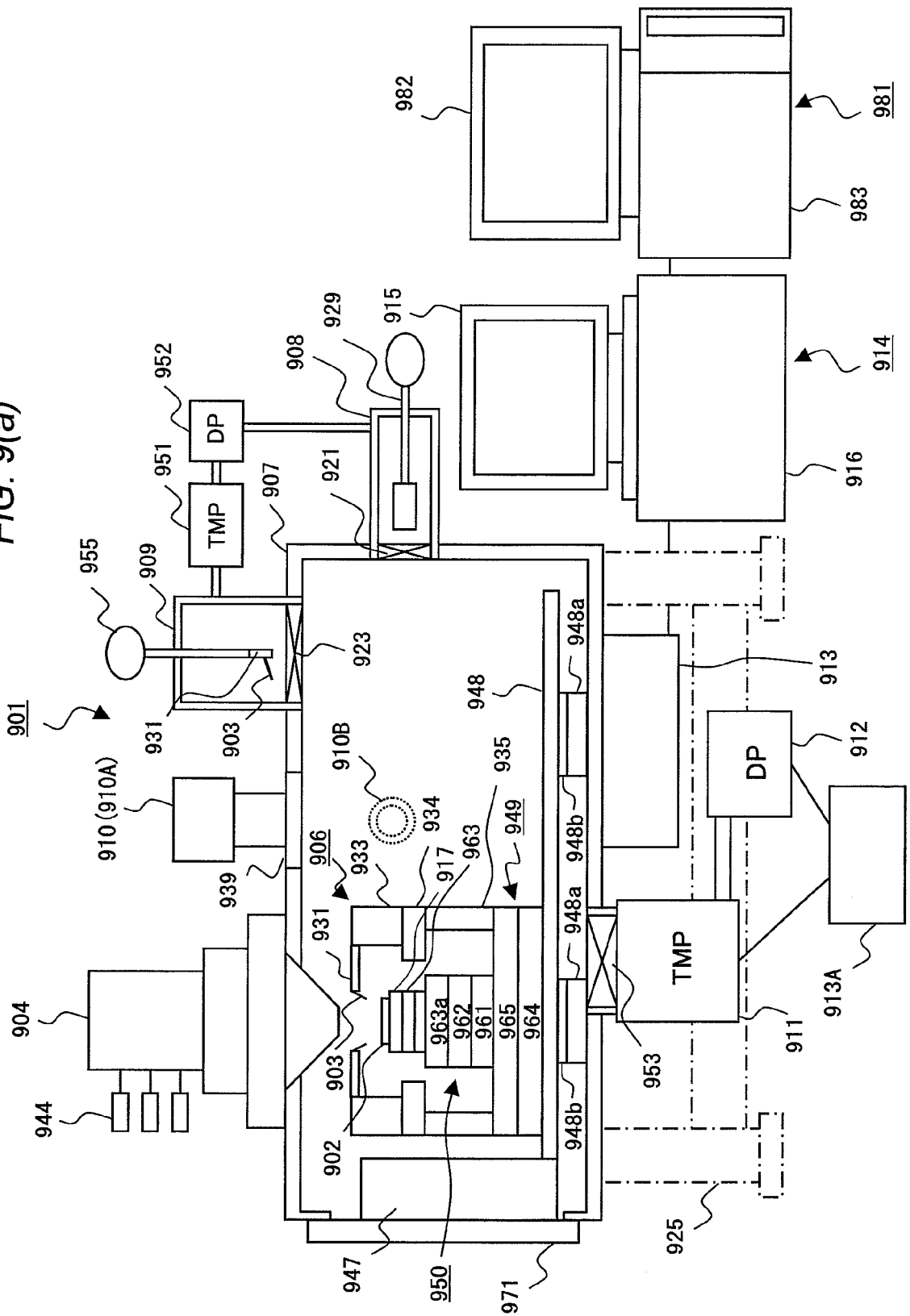
FIGS. 9A to 9D are a drawing illustrating another example of the configuration of a defect inspection device and detail drawings thereof.

A fourth embodiment, or another embodiment, of the present invention will be described referring to FIGS. 9A to 9D and FIGS. 10A and 10B. FIG. 9A illustrates the configuration of a defect inspection device 901 in the fourth embodiment. In FIG. 9A, the defect inspection device 901 comprises: a stage device including a test piece holder 902 which holds a test piece in a test piece chamber 907 and a test piece holder rest 917 which holds the holder; and a probe stage 906 including a probe unit 933. A test piece is secured on the test piece holder 902. Since the test piece is thin, however, it is not shown in FIG. 9A for convenience for drawing. For inspection on test pieces, an electro-optical device 904 (which can be considered as a charged particle device), such as SEM (Scanning Electron Microscope) or FIB (Focused Ion Beam) device, having ion pumps 944 is provided. The electro-optical device 904 is installed on the enclosure of the test piece chamber 907 so that the electro-optical device 904 is opposed to the test piece holder 902. Roughly approximated probe image acquiring devices 910 are provided in proximity to the electro-optical device 904. A charged particle beam (electrons or ion beam) is radiated from the electro-optical device 904 toward the test piece holder 902 for observing the surface of a test piece and the movement of probes 903.

One of the roughly approximated probe image acquiring devices 910 is provided on the upper face of the enclosure of the test piece chamber 907 in proximity to the electro-optical device 904. Each of the image acquiring devices 910 comprises a probe roughly approximating optical microscope and a CCD camera for acquiring images. The image acquiring devices 910 are capable of observing the way the probes 903 are roughly approximated to a test piece and acquiring it as image information. One 910A of the roughly approximated probe image acquiring devices 910 is vertically installed, and the other 910B is horizontally installed so that both the image acquiring devices 910 are disposed crisscross. This crisscross disposition makes it possible to observe the probes 903 not only from above but also sideways, and the state of rough approximation can be grasped with reliability. At this time, the image acquiring devices 910 are so constituted that the magnification of the image acquired sideways is higher than the magnification of the image acquired from above. This is because of the following: in measurement, first, rough approximation is carried out by the roughly approximated probe image acquiring device 910A positioned above. Thereby, the probes 903 are horizontally brought closer to one another. At this time, a plurality of the probes 903 must be captured into a rough approximation image. In rough approximation by the image acquiring device positioned sideways, the probes 903 are moved down and brought closer to the test piece while the sideways rough approximation image is being viewed. Thereafter, the probes 903 are brought into contact with the test piece while the state of focusing on the tips of the probes 903 and the test piece is being checked using the electro-optical device 904. If the distance between the probes 903 and the test piece is short in sideways rough approximation, the time required to bring the probes 903 close to the test piece using the electro-optical device 904 can be shortened. For this reason, the magnification of the rough approximation image captured sideways is made higher than the magnification of the rough approximation image captured from above.

Figure 10A:
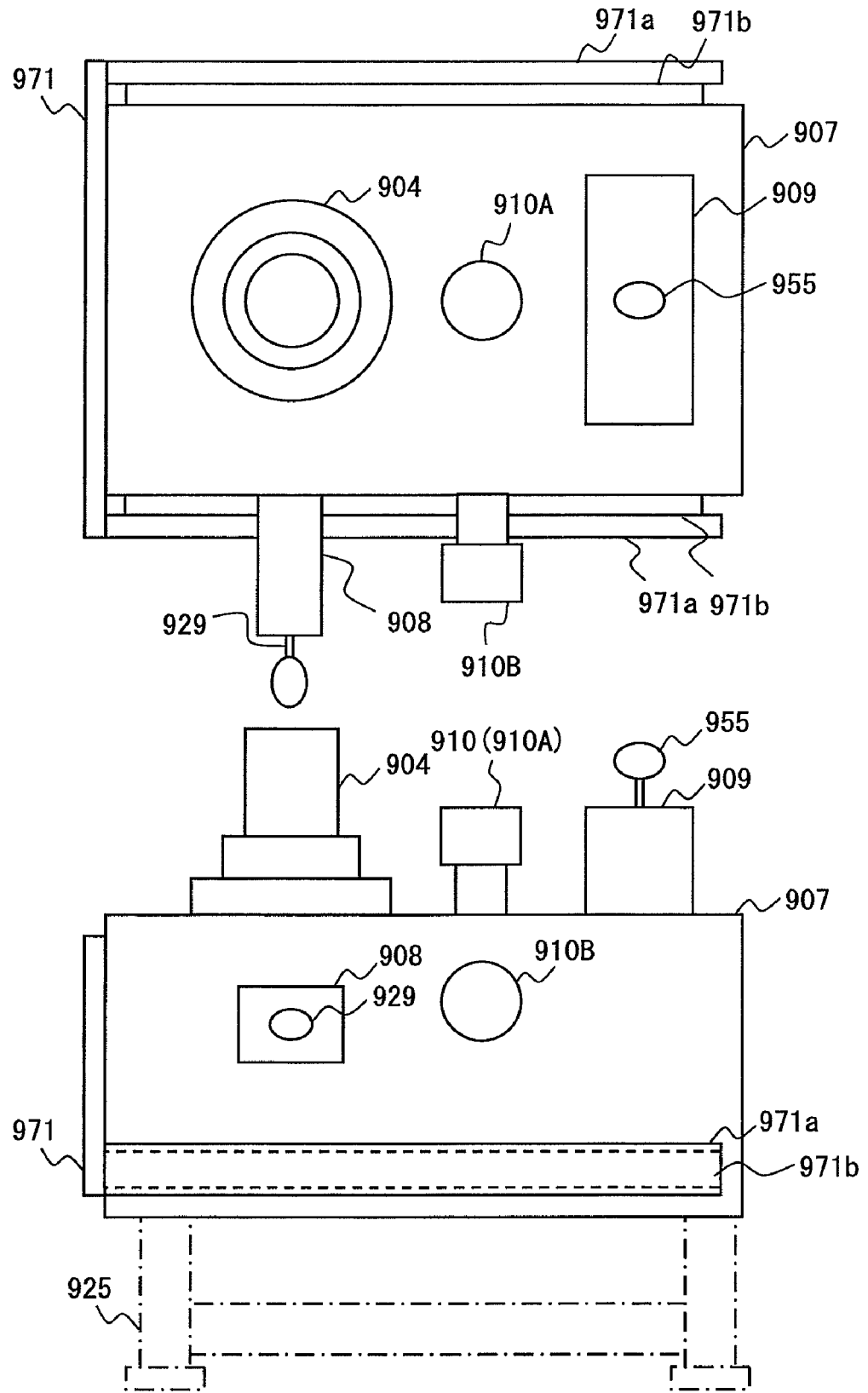
FIG. 10A is a block diagram of a defect inspection device in a fourth embodiment.
Figure 10B:
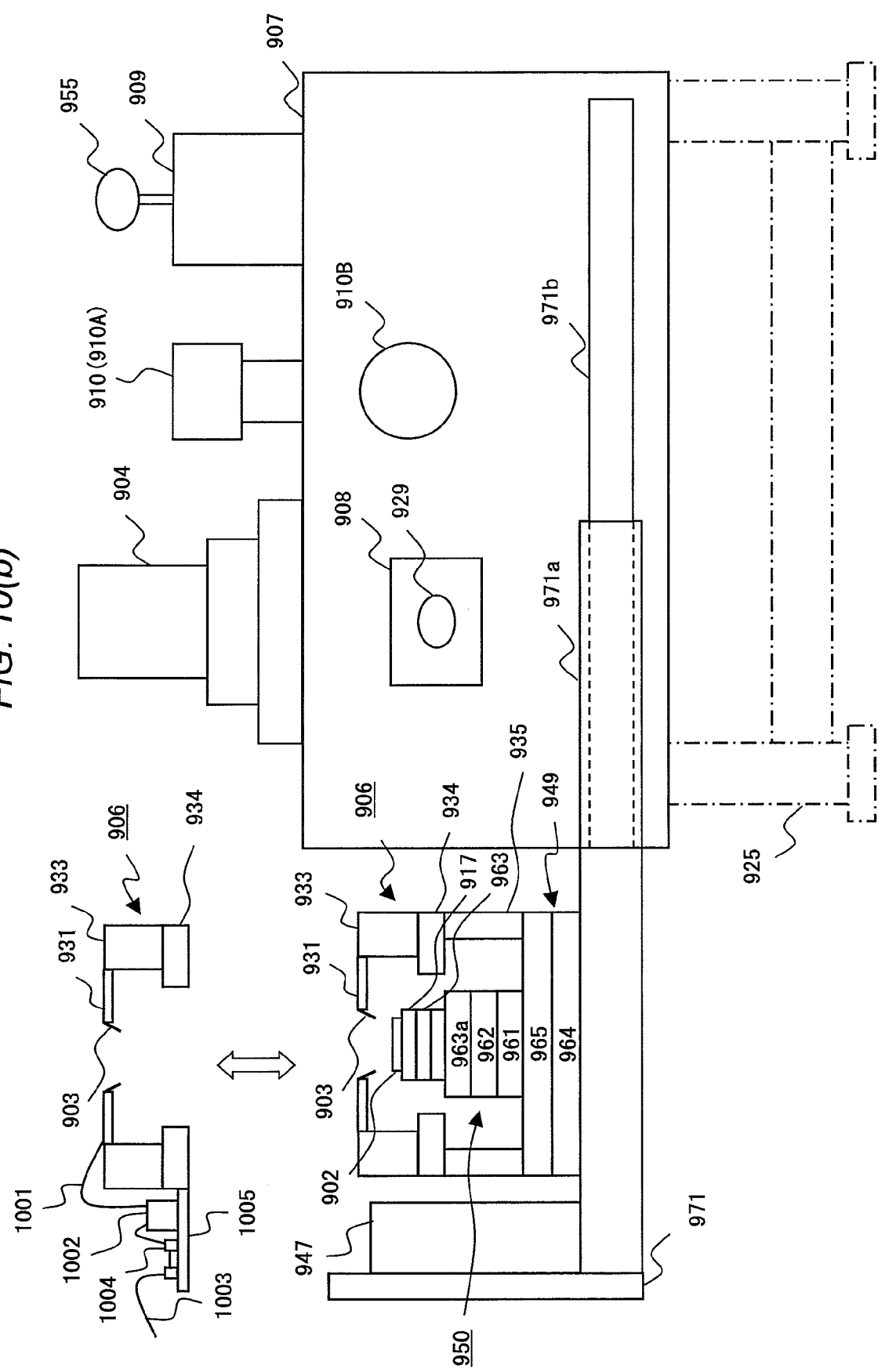
FIG. 10B is a block diagram of the defect inspection device in the fourth embodiment.

The stage device comprises: the test piece holder 902 which holds a test piece; a test piece stage 950 on which the test piece holder 902 is placed; a large stage 949 on which the test piece stage 950 is placed; and a base 948 on which the large stage 949 is moved. The stage device is installed on the side face of the test piece chamber 907 through a face plate 971. The face plate 971 is installed on the test piece chamber 907 through a guide coupling board 971a and a guide 971b using rollers, as illustrated in FIG. 10A. The upper drawing in FIG. 10A is a top view, and the lower drawing is a side view. As illustrated in FIG. 10B, the stage device is pulled out along the guide 971b when the stage device is maintained or the probe unit is replaced. The guide blocks 948a installed at the lower part of the test piece chamber 907, illustrated in FIG. 9A, are used to position the stage device relative to the electro-optical device 904 in the vertical direction. Further, when the stage device is pulled out of the test piece chamber 907, the guide blocks 948a guide the stage device. A sliding member 948b is bonded to the upper faces of the guide blocks 948a which sliding members are easily slidable between the guide blocks and the underside of the base 948.

The probe stage 906 comprises: the probe unit 933 having probe holders 931 for holding the probes 903; a probe unit base 934 which holds the probe unit 933; and a probe unit stand 935 which connects the probe unit base 934 to the large stage 949.

The probe unit 933 comprises x, y, and z tables (not shown), and is capable of the probes 903 in the three-dimensional directions.

The base 948 is fixed on the face plate 971 by a fixing member 947. The test piece chamber 907 is provided with a test piece replacement chamber 908 and a probe replacement chamber 909.

The face plate 971 is provided with feedthroughs for transmitting the following signals from the outside of the test piece chamber 907: signals for controlling the operation of the x, y, and z tables of the probe unit 933; and signals for controlling the operation of the x, y, and z tables 961, 962, 963, and 963a of the test piece stage 950.

The interior of the test piece replacement chamber 908 and the interior of the test piece chamber 907 are connected to each other through a gate valve 921. The interior of the test piece replacement chamber 908 is connected to DP (Dry Pump) 952, and vacuumized. Thus, with the test piece chamber 907 kept in vacuum, the test piece holder 902 with a test piece held thereon can be replaced by a transporting means 929. FIG. 9A is depicted as if the test piece replacement chamber 908 were connected to the right side face of the test piece chamber 907, for convenience for drawing. In actuality, the test piece replacement chamber 908 is provided on the side face of the test piece chamber 907, positioned on this side of FIG. 9A. This is for test pieces to be easily placed on the stage device located under the electro-optical device 904, as illustrated in FIG. 10A.

The probe replacement chamber 909 is provided on the upper face of the enclosure of the test piece chamber 907, in addition to the electro-optical device 904 and the roughly approximated probe image acquiring device 910A. The probe replacement chamber 909 is provided in proximity to the roughly approximated probe image acquiring device 910A. The interior of the probe replacement chamber 909 and the interior of the test piece chamber 907 are connected to each other thorough a gate valve 923. The probe replacement chamber 909 is connected to TMP (Turbo Molecular Pump) 951 and the DP 952 joined therewith, and is vacuumized. With the test piece chamber 907 is kept in high vacuum, the probe unit 931 is replaced by a replacing means 955.

The test piece chamber 907 is connected with TMP 911 through a gate valve 953, and the TMP 911 is in turn connected to DP 912. The enclosure of the test piece chamber 907 is supported on a frame 925 indicated by alternate long and short dash line.

A controller 913 and another controller 913A are provided. The controller 913 comprises a probe unit control unit and a stage control unit, and the another controller 913A controls high vacuum processing by the TMP 911 and the DP 912. The controller 913A also controls the TMP 951 and the DP 952.

The defect inspection device 901 further comprises a display device 914 having an image display unit 915 and an image display control unit 916. Operation signals for the probes 903 and the stage device, from the image display control unit 916, are transmitted to the probe unit control unit and the stage control unit. The probe unit 933, stage device, and large stage 949 are thereby controlled.

The defect inspection device 901 further comprises CAD WS 981 having an image display unit 982 and an image display control unit 983. The CAD WS 981 is connected to the display device 914, and transmits CAD image data to the display device 914 as required.

Before a probe is replaced, the y table and the x table of the probe unit 933 are moved to a predetermined position (e.g. rear end), and the z table is moved to a predetermined position (e.g. upper end).

The test piece stage 950 is moved so as to display the following on the image display unit 915 for displaying image information from the electro-optical device 904: a region on the test piece to be measured, that is, a region with which the probes 903 are to be brought into contact. While the probes 903 and the test piece are viewed, the x, y, and z tables of the probe unit 933 are operated to bring the probes 903 into contact with the region on the test piece to be probed.

In the present invention, there is no special limitation on the driving devices for the probes 903 and the stage device. However, a drive mechanism using piezo element, DC motor, or ultrasonic motor, for example, is used for the drive mechanism for the probes. Pulse motor, DC motor, ultrasonic motor, or the like is used for the drive mechanism for the stage device.

Hereafter, description will be given to the constitution and operation of the major elements of the inspection device.

Figure 9B:
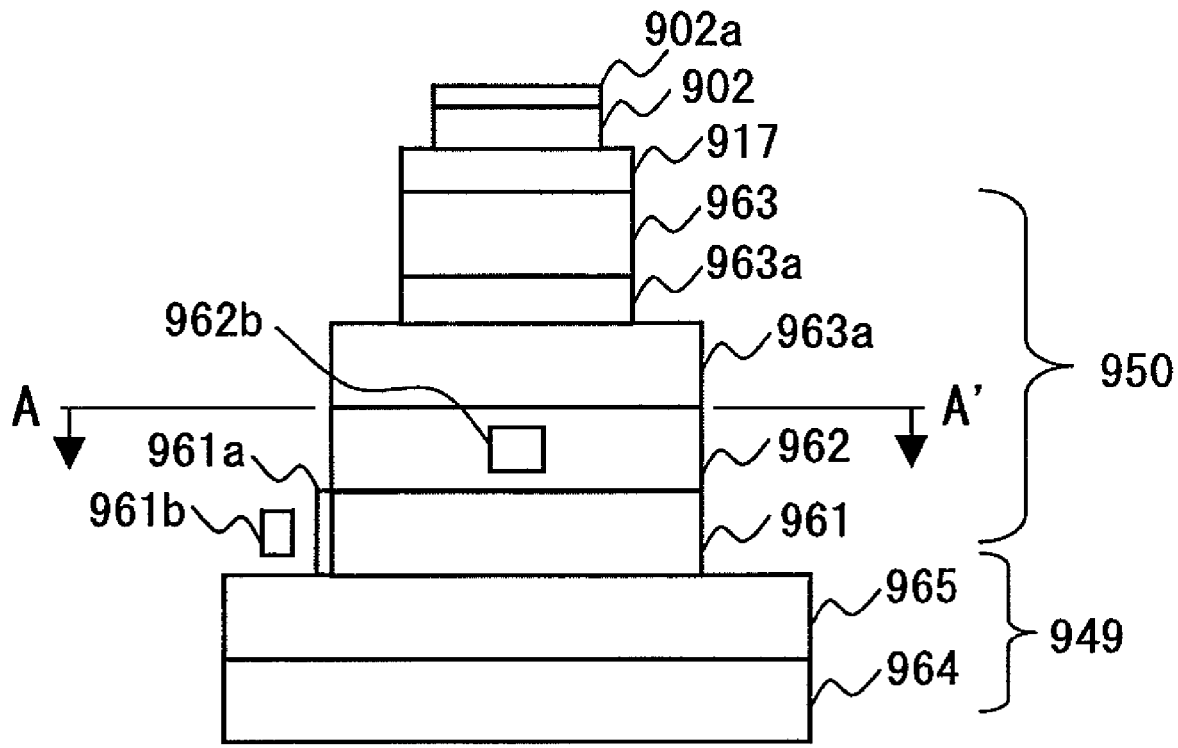
Figure 9B:
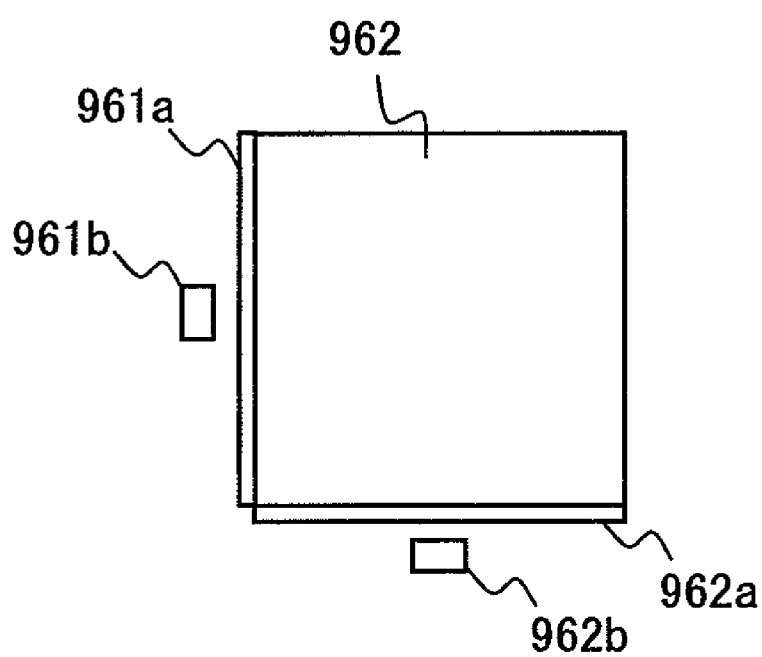
Figure 9C:
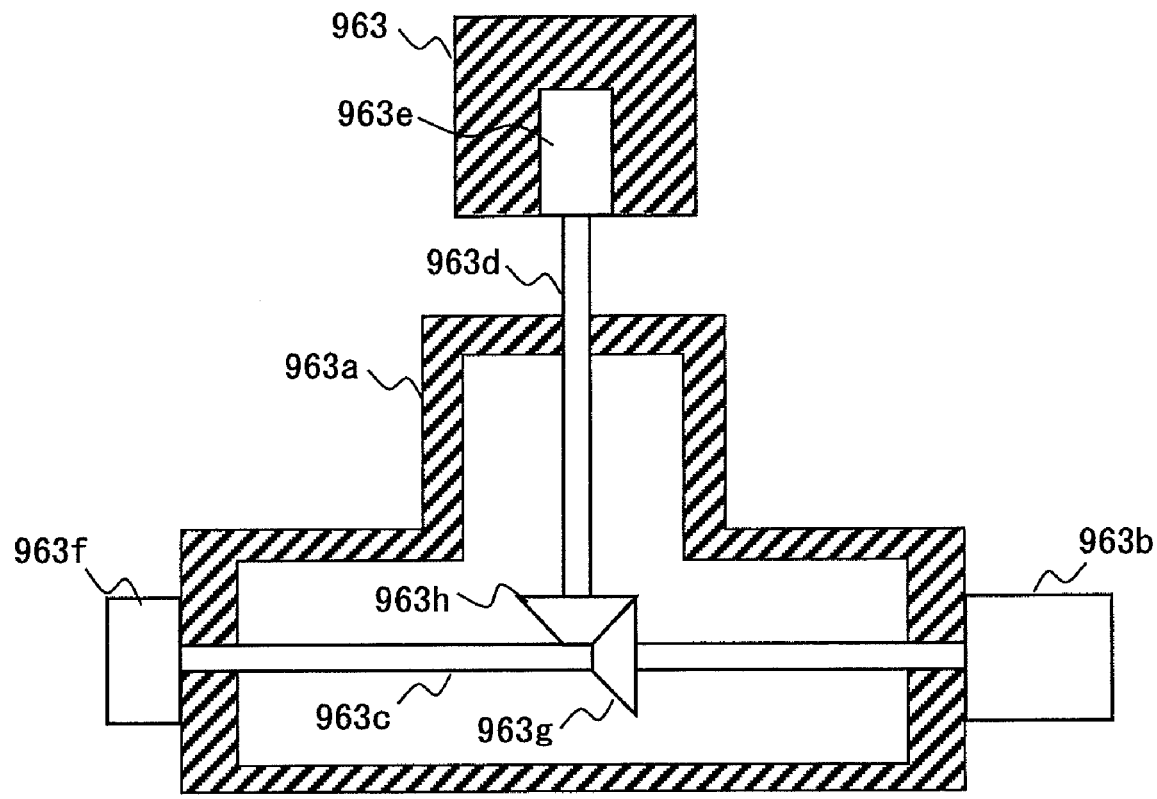
Figure 9D:
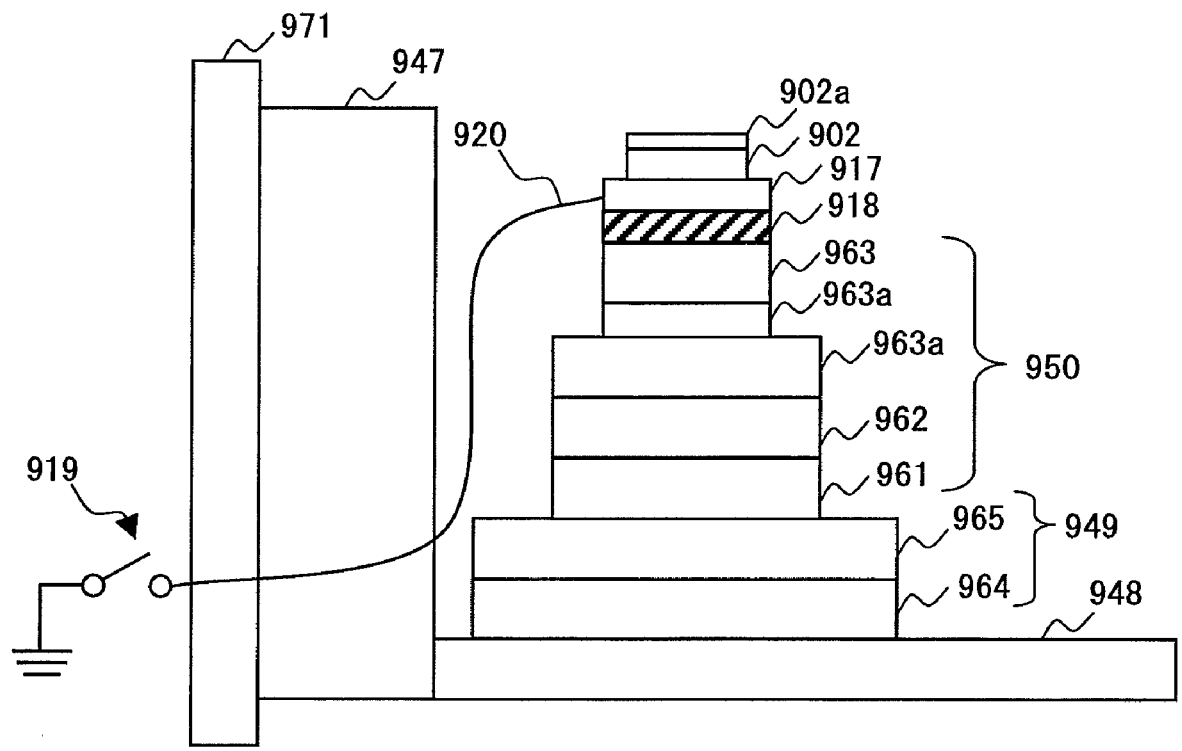

1. Constitution and Operation of Major Elements of Inspection Device (1) Stage Device FIGS. 9B, 9C, and 9D are detail drawings of the stage device. The stage device comprises the large stage 949 and the test piece stage 950.

(a) Test Piece Stage 950

The test piece stage 950 comprises the y table 962, x table 961, and z table 963 and 963a, and each table is moved in the y, x, or z direction by the drive mechanism. Since the test piece stage 950 is provided with a driving means for movement in the z (vertical) direction, the following advantage is brought: the test piece stage 950 is moved down in the z-direction before the large stage 949 and the test piece stage 950 are moved in the x and y directions. Thereby, mechanical interference between the test piece 902a and the tip of the electron gun 904 can be avoided. When the fourth embodiment is actually used to carry out SEM observation, the following advantage is brought: the test piece stage 950 is moved up in the z direction, and thereby the working distance between the tip of the electron gun 904 and the test piece 902a can be reduced. As a result, the spatial resolution of SEM can be enhanced. In the fourth embodiment, the driving means for movement in the z direction is incorporated into the test piece stage 950. Instead, it may be incorporated into the large stage 949 or both of them. In these cases, the same effect is obtained.

The movement of the y and x tables 962 and 961 is accomplished by driving ball screws by DC motors placed in the test piece chamber 907, and they are guided by cross rollers (not shown). As illustrated in FIG. 9C, the movement of the z table 963 is accomplished by driving a DC motor 963*b* installed in the z table 963*a* and thereby driving a ball screw 963*e* by shafts 963*c* and 963*d* through bevel gears 963*g* and 963*h*. The z table is guided by cross rollers (not shown). As illustrated in FIG. 9A and FIG. 9B, the test piece holder 902 and the test piece 902*a* are fixed on the test piece holder rest 917 installed on the z table 963. Therefore, the test piece 902*a* is moved in the x, y, and z directions with respect to electron beam. The z table 963 has a measuring position, test piece replacement position, and probe replacement position. The measuring position is a position in which the probes 903 are brought into contact with the test piece 902*a*. The test piece replacement position is a position lower than the measuring position, and the probe replacement position is a position at a further lower level. BY using these positions, collision between the test piece 902*a* and the probes 903 is prevented when the probes 903 or the test piece 902*a* is replaced. When these operations are performed, accurate and reproducible movement can be accomplished by taking the following procedure: measuring elements, such as linear scale or encoder, are provided in the test piece stage 950, and the moving distance is quantitatively measured. FIG. 9B and FIG. 9C illustrate examples of the installation positions of the measuring elements. With respect to the x table 961 and the y table 962, linear scales can be installed as illustrated in FIG. 9B. The upper drawing in FIG. 9B illustrates a side view, and the lower drawing illustrates a top view taken along the line AA'. The linear scales comprise mirrors 961*a* and 962*a* installed on the x table 961 and the y table 962, and measuring elements 961*b* and 962*b*. The moving distance of the z table 963 in FIG. 9C can be measured by installing an encoder 963*f* on the shaft 963*c*. In this example, the following items are used for measuring the moving distance: an encoder which measures the rotation angle of a DC motor with respect to the z table 963, and linear scales with respect to the x table 961 and the y table 962. Instead, with respect to all of them, encoders may be used or linear scales may be used. Or, a combination of them may be used.

To carry out SEM observation, a test piece 902*a* attached to the test piece stage 950 ought to be grounded via the test piece stage 950 and/or the test piece chamber 907. This brings an advantage of prevention of the influence of electrical noise and charge-up arising from SEM observation. On the other hand, to carry out measurement of electrical characteristics of a test piece 902*a*, the test piece 902*a* ought to be electrically insulated from the test piece stage 950 and the test piece chamber 907. This brings an advantage of prevention of the influence of electrical noise from carrying out the electrical characteristics measurement. Also, to prevent affection of charge-up, the electron beam emitted from electron gun of the electro-optical device 904 ought to be blanked. In the present invention, the electrical characteristics of test pieces 902*a* are measured. Therefore, the following effect is similarly obtained: test pieces 902*a* can be prevented from being influenced by electrical noise or charge-up arising from SEM observation. For electrical insulation, for example, the following procedure can be taken: as illustrated in FIG. 9D, an insulating material 918 is placed between the test piece holder rest 917 and the z table 963. The holder rest 917 which holds the test piece 902*a* is connected to a cable 920. The cable 920 is led through the fixing member 947 and the face plate 971 to outside of vacuum, and led to a ground terminal through a changeover switch 919. With this constitution, the influence of noise or charge-up can be prevented by connecting the test piece 902*a* to ground by the changeover switch 919 during SEM observation. The following can be implemented by connecting the test piece 902*a* to an electrical characteristics measuring device, not to ground, by the changeover switch 919: measurement of electrical characteristics, for example, the value of absorption current of the test piece 902*a*, can be carried out without the influence of noise from the test piece stage 950 or the test piece chamber 907.

Further, in the fourth embodiment, the following constitution may be adopted: a guard electrode and a ground electrode are provided in the probe holders 931 and the test piece holder rest 917; and signals detected at the probes 903 and the test piece 902*a* are led to outside of vacuum. This produces the effect of enhancing the electrical insulation for the probes 903 and the test piece 902*a*.

(b) Large Stage 949

As illustrated in FIG. 9A and FIG. 9B, the large stage 949 comprises the y table 965 and the x table 964, and is moved in the y direction and in the x direction by driving devices (not shown). The test piece stage 950 is driven as is placed on the large stage 949.

As illustrated in FIG. 9A, on the large stage 949, the probe unit 933 constituting the probe stage 906, the probe unit base 934 which supports the probe unit 933, and the probe unit stand 935 are placed. The probe unit 933 is moved in the y direction, x direction, and z direction. As a result, the probe holders 931 supported on the probe unit 933 are moved, and the probes 903 held at the tips of the probe holders are moved in the y direction, x direction, and z direction.

The large stage 949 is moved on the base 948, and the test piece stage 950 is moved on the large stage 949. The electro-optical device 904, roughly approximated probe image acquiring device 910A, and probe replacement chamber 909 are provided in parallel on the upper face of the enclosure of the test piece chamber 907. Therefore, the moving mechanisms can move the test piece 902*a* and the probes 903 to the roughly approximated probe image acquiring potion, SEM observation position, and probe replacement position. That is, the moving mechanisms can move the stage device (the test piece stage 950 and the probe stage 906) between the following positions: any position in the vertical direction with respect to the roughly approximated probe image acquiring device 10; any position in the vertical direction with respect to the electro-optical device 904; and any position in the vertical direction with respect to the probe replacement chamber 909.

Therefore, the test piece 902*a* and the probes 903 are moved between the following positions: any position in the vertical direction with respect to the roughly approximated probe image acquiring device 910; any position in the vertical direction with respect to the electro-optical device 904; and any position in the vertical direction with respect to the probe replacement chamber 909.

One of the features of the present invention is that movement on the base 948 can be carried out with high vacuum maintained. Adoption of such a moving method makes it possible to roughly approximate the probes 903 to a test piece 902*a* and position them with accuracy. Furthermore, the moving method makes it possible to quickly and easily carry out these operations. In replacement of a probe 903, the probe 903 can be quickly and easily replaced with another with high vacuum maintained.

Therefore, the moving mechanisms can perform the following operation with high vacuum maintained: it can move the test piece 902a and the probes 903 from a position directly under the roughly approximated probe image acquiring device 910 provided in parallel with the electro-optical device 904 to a position directly under the electro-optical device 904.

(3) Scanning Electron Microscope (SEM)

This is an example of the electro-optical device 904. It is used as an observing means for bringing the probes 903 into contact with a target location on the test piece 902a, and is disposed at the upper part of the test piece chamber 907. Vacuum evacuation is carried out by the ion pumps 944.

(4) Test Piece Chamber 907

The test piece chamber 907 comprises a lid and a test piece chamber case as an enclosure. On a side face of the test piece chamber case, the base 948 is installed to the face plate 971 with the fixing member 947 in-between. The probe unit 933 is placed on the large stage 949 in the test piece chamber 907, and the test piece replacement chamber 908 is installed on another side face. On the lid, the electro-optical device 904, or SEM, roughly approximated probe image acquiring device 910, and probe replacement chamber 909 are installed. The test piece chamber 907 is fixed on a load plate installed on a vibration-free mount installed on the frame 925. The test piece chamber 907 is evacuated to vacuum by the TMP 911 and the DP 912.

(5) Optical microscope for Probe Rough Approximation, CCD Camera, Roughly Approximated Probe Image Acquiring Device Test pieces 902a whose electrical characteristics are to be measured are, for example, semiconductor. Usually, the probes 903 are brought into contact with plugs connecting to source, drain, gate, or well. The smallest plugs are a few tens of nm in diameter, and SEM with high resolution is required for bringing the probes into contact with the plugs. However, when a semiconductor test piece is irradiated with an electron beam, a problem arises: the test piece can be damaged by the electron beam. In this case, it is preferable that the irradiation time should be shortened as much as possible. For this purpose, based on a detection value from the roughly approximated probe image acquiring devices 910, the following operation is performed beforehand: a plurality of the probes are brought closer to one another in the horizontal direction, and brought closer to the surface of the test piece in the vertical direction. The image obtained by the optical microscope for probe rough approximation and the CCD camera installed to the microscope is displayed on the monitor of the image display unit 915, and the above operation is performed while this image is viewed.

The magnification of the image on the monitor is set to several dozen times so that the probes 903 will be brought closer to one another as much as possible and the probes 903 and the test piece 902a can be captured in one screen.

A light source is disposed adjacently to the optical microscope for probe rough approximation. Observation under the optical microscope for probe rough approximation and the CCD camera and introduction of light from the light source into the test piece chamber are carried out through the observation window 939 illustrated in FIG. 9A.

(6) Test Piece Replacement Chamber 908

The test piece replacement chamber 908 is provided so as to replace a test piece 902a without breaking the vacuum of the test piece chamber 907, and is evacuated to vacuum by the DP 952. The test piece replacement chamber 908 is separated from the test piece chamber 907 by the gate valve 921. When a test piece 902a is let in, the following procedure is taken: a male screw at the tip of a replacement rod which is the transporting means 929 for the test piece 902a and the test piece holder 902 is screwed into a female screw provided in the test piece holder 902 with the test piece 902a is bonded thereto. The gate valve 921 is opened, and the test piece holder is inserted onto the holder rest 917 installed on the upper face of the z table 963 of the test piece stage 950. When a test piece 902a is taken out, the above operation is performed in reverse order. This shortens the time required for replacing test pieces.

(7) Probe Replacement Chamber 909

The probe replacement chamber 909 is provided so as to replace probes 903 without breaking the vacuum of the test piece chamber 907. It is for shortening the time required for replacing probes. The probe replacement chamber 909 is separated from the test piece chamber 907 by the gate valve 923. The probe replacement chamber 909 is evacuated to vacuum by the TMP 951 and the DP 952. The reason why the TMP 951 is used is as follows: the probe replacement chamber 909 is big. Therefore, if it is evacuated only by the DP 952, the gate valve 923 is opened when the probe replacement chamber 909 is under high pressure. As a result, it takes a longer time to restore the pressure in the test piece chamber 907 to the original value after replacement.

2. Control System

The various parts of the SEM, probe unit 933, and stage device are controlled by the respective control circuits and computers built in the controller 913. The SEM, probe unit 933, and stage device can be operated through either of the respective operation panels and the GUI on the monitor.

The controller 913 comprises the stage control unit for controlling the position of each stage, and the probe control unit for driving the probe unit 933 independently of the stage device. The image control unit 916 includes a secondary electron detector control unit, the control unit for an electron beam irradiation optical system, and the like. In addition, a computation processing unit is provided with a function of displaying the probe holders 931, the test piece 902a, the state in which the probes 903 are in contact with the test piece 902a, and the like in the form of image. At this time, the computation processing unit displays images in combination with the control unit for the display device 914.

Further, by operating the operation screen on the image display unit, operation signals are supplied to the probe unit control unit and the stage control unit through the image display control unit. Thereby, the probe unit 933 and the stage device are moved and positioned. Aside from this, the probe unit 33 and the stage device may be moved and positioned using an operation panel having a joystick.

(1) SEM

An electron beam produced in the electron gun is applied to the test piece 902a through a convergent lens and an objective lens. Secondary electrons produced at the test piece 902a are detected by the secondary electron detector. The resulting signals are subjected to varied electrical processing in the display, and the image of the test piece surface is displayed on the monitor of the image display unit 915 of the display device 914.

(2) Probe Unit 933

Signals for controlling the operation of the x, y, and z tables of the probe unit 933 are supplied as follows: as illustrated in FIG. 9A, signals from the control circuit 913 in the frame 925 are supplied to the probe unit 933 in the test piece chamber 907 via the feedthroughs installed in the face plate 971 of the stage device.

Input signals supplied to a test piece 902a through the probes 903 installed on the probe holders 931, and output signals obtained from a test piece 902a are inputted/outputted as follows: the signals are inputted or outputted to, for example, a semiconductor parameter analyzer through three-layered coaxial hermetic connectors installed on the test piece chamber 907.

(3) Stage Device

Signals for controlling the operation of the x, y, and z tables 961, 962, 963, and 963a of the test piece stage 950 of the stage device are supplied as follows: signals from the control circuit in the frame 925 are supplied to the test piece stage 950 in the test piece chamber 907 via the feedthroughs installed in the face plate 971.

3. Display Device 914

The display device 914 displays rough approximation images obtained at the roughly approximated probe image acquiring devices 910 and the image of the contact of the probes 903 with the test piece 902a obtained at the electro-optical device 904. More specific description will be given. The display device 914 displays a probe operating screen and an operating procedure screen which shows the details of the operating procedure.

Following the operating procedure shown in the operating procedure screen, the user positions the test piece 902a and the probes 903 with accuracy while viewing a rough approximation image and a probing image.

4. CAD Workstation (CAD WS) 981

The defect inspection device 901 comprises the CAD WS 981 provided with the image display unit 982 and the image display control unit 983. The CAD WS 981 is connected to the display device 914, and transmits CAD image data to the display device 914 as required.

With the above-mentioned constitution, as in the procedure described in detail in connection with the first embodiment, the following operation can be performed: while CAD information is viewed, the test piece stage 950 is moved. Thereby, a region on the test piece 902a to be measured, that is, a region with which the probes 903 are to be brought into contact is displayed on the image display unit 915 for displaying image information from the electro-optical device 904. While the SEM image and the CAD image of the probes 903 and the test piece 902 are viewed, the probe unit 933, that is, the probes 903 are moved in the x, y, and z directions. Thereby, the probes 903 are brought into contact with the region on the test piece 902a with which the probes are to be brought into contact.

In the fourth embodiment, the accuracy of movement of the test piece stage 950 can be enhanced and quantified by incorporating linear scales or encoders into the test piece stage 950, as illustrated in FIG. 9B. This produces the effect of CAD navigation being carried out more accurately.

With this constitution, EBAC measurement which is described in detail in connection with the third embodiment can also be carried out. When EBAC measurement is carried out, as described in detail with respect to the third embodiment, the value of absorption current measured by the probes 903 or the test piece 902a is often very small. For this reason, detected signals can be influenced and deteriorated by noise. In this case, the following procedure can be taken instead of connecting the test piece 902a and the probes 903 directly to the electrical characteristics measuring device: a preamplifier is respectively placed in the wiring between the test piece 902a and the probes 903, and the electrical characteristics measuring device in proximity to the test piece 902 and in proximity to the probes 903. Then, microcurrent detected at the probe 903 and the test piece 902a is amplified, and then transmitted to the electrical characteristics measuring device. FIG. 10B illustrates a constitution for amplifying absorption current signals detected by the probes 903 through the preamplifier. In FIG. 10B, a signal detected by the probes 903 is transmitted to the preamplifier 1002 through a cable 1001. The signal amplified here is guided to outside of vacuum from a cable 1003 through a hermetic connector provided in the face plate 971. The cable 1003 is fixed on a mounting seat 1005 by a relay terminal 1004. The preamplifier 1002 is also installed on the mounting seat 1005. The mounting seat 1005 is in turn fixed on the probe unit base 934. The place of this fixation is not limited to the probe unit base 934, and it may be fixed on any other fixing seat as long as the fixing seat can be disposed in proximity to the test piece and the probes. As mentioned above, FIG. 10B illustrates the constitution of the preamplifier for amplifying signals from the probes. To amplify signals from test pieces, the same constitution can be adopted. Depending on whether EBAC measurement is to be carried out or not, signals from the probes or the test piece may be connected to or disconnected from the preamplifiers. As illustrated in FIG. 10B, instead, a probe stage mounted with a preamplifier and a probe stage not mounted with a preamplifier may be prepared beforehand and selectively utilized. This produces the effect of EBAC measurement being carried out with the influence of noise on microcurrent being reduced.

The fourth embodiment is provided with a function of updating the displayed CAD image in accordance with change in the fields of view embracing the SEM image and the EBAC image by the same method as described with respect to the first embodiment. Therefore, with a defect inspection device of the fourth embodiment, a burden on the equipment user is significantly lessened during probing.

In the fourth embodiment as in the third embodiment, only one probe 903 is used in defect inspection in some cases and a plurality of probes are required in other cases. For example, when a plurality of pieces of wiring are inspected for break or on like occasions, these pieces of wiring can be inspected at a time by probing a plurality of plugs.

In FIG. 9A, the defect inspection device of the fourth embodiment looks to use only two probes 903. In actuality, however, more than two probes are used sometimes.

In the fourth embodiment as in the first embodiment and the third embodiment, the SEM image and the CAD image or the EBAC image and the CAD image can be displayed in superimposition (not shown). Thereby, the equipment users' convenience is further enhanced when the user finally manually brings probes in contact and estimates the location of a break.

In the fourth embodiment as in the first embodiment, an arrow indicating an area can be displayed over the CAD image at low magnification (not shown). Thereby, the equipment users' convenience can be enhanced when the user manually moves the probes.

In the fourth embodiment, SEM images and EBAC images can be obtained. These images can be displayed on the image displaying means 915 provided to the display device 914. At this time, the operating screen of the image displaying means 915 provided to the display device 914 can display all or any of the SEM image, EBAC image, and CAD image. If the operating screen is provided with icons for changing the screens, various type of display can be implemented. For example, arbitrary images can be selectively displayed, all displayed, or displayed in superimposition.

In the fourth embodiment, the display device 914, CAD workstation 981, and other control units are constituted as separate computers. As in the first embodiment, they may be integrated and constituted as a single computer.

As mentioned above, the introduction of CAD navigation produces the effect of remarkably enhancing the users' convenience when bringing probes into contact with probing positions.

In the above description of the present invention, semiconductor is taken as an example of test piece. To measure local electrical characteristics, the device of the present invention may be used for the measurement of other test pieces than semiconductor. For example, the device may be used for the measurement of the local insulation resistance of a magnetic head or the like.

The defect inspection device based on a combination of probes and a charged particle beam system, proposed here, has a configuration suitable for the introduction of CAD navigation. The present invention remarkably enhances the users' convenience when bringing probes into contact with probing positions.

The present invention enhances the equipment users' convenience when using a charged particle beam system with probes incorporating CAD navigation. That is, the present invention makes it possible to provide a probe navigation method and device and a defect inspection device wherein probing can be easily carried out regardless of the equipment user's level of skill.

What is claimed is:

1. A charged particle beam system for measuring electrical characteristics of a sample, comprising:
    a plurality of probes to detect an electrical current or voltage or electrical signal from the sample, each of the probes having a tip for contacting a sample;
    an electro-optical device to irradiate the sample with a charged particle beam and to obtain a second charged particle image by detection of a second charged particle beam resulting from irradiation of the sample;
    an electrical characteristics measuring instrument to measure the electrical characteristics of the sample based on the electrical current or the voltage or the electrical signal detected by the probe;
    a computer connected to a CAD image storing means for storing layout pattern of the sample, and
    a displaying unit for displaying the second charged particle image and a first CAD stored in the CAD image storing means such that the second charged particle image is lying on the first CAD.

2. A charged particle beam system for measuring electrical characteristics of a sample according to claim 1, wherein the second charged particle image and the first CAD are displayed on the displaying unit after tips of all probe for measuring electrical characteristics of the sample embrace in the second charged particle image.

3. A charged particle beam system for measuring electrical characteristics of a sample according to claim 2, wherein the second charged particle image and the first CAD are displayed on the displaying unit before the tip of the probe contacts the sample.

4. A charged particle beam for measuring electrical characteristics of a sample according to claim 1, wherein the second charged particle image and the first CAD are displayed on the displaying unit before the tip of the probe contacts the sample.

5. A charged particle beam system for measuring electrical characteristics of a sample according to clam 1, wherein one can bring probes into contact with points to be inspected by watching the second particle image and the first CAD.

6. A charged particle beam system for measuring electrical characteristics of a sample according to claim 1, further comprising:
    a means for placing the sample by movement in X, Y and Z directions, the means for placing further comprising:
    a first stage having a sample placing surface;
    a first stage driving unit for driving the first stage;
    a second stage on which the prove driving unit and the first stage are built;
    a second stage driving unit for moving the second stage;
    a probe driving unit for diving the plurality of probes; and
    a controlling unit for controlling the probe driving unit, the first stage driving unit, and the second stage driving unit.

7. A charged particle beam system comprising:
    a plurality of probes to detect an electrical current or voltage or electrical signal from the sample, each of the probes having a tip to contact a sample;
    an electro-optical device to irradiate the sample with a charged particle beam and to obtain an image of the sample by detecting secondary charged particles resulting from irradiation of the charged particle beam;
    an electrical characteristics measuring instrument to measure the electrical characteristics of the sample based on the electrical current or the voltage or the electrical signal detected by the probe;
    a computer connected to a storage device to store a CAD image of layout pattern of the sample, and
    a display to display the image superimposed on the CAD image.

8. A charged particle beam system according to claim 7, wherein the image and the CAD image are displayed on the display image after tips of all probe to measure electrical characteristics of the sample embrace in the image.

9. A charged particle beam system according to claim 8, wherein the image and the CAD image are displayed on the display before the tip of the probe contacts the sample.

10. A charged particle beam system according to claim 7, wherein the image and the CAD image are displayed on the display before the tip of the probe contacts the sample.

11. A charged particle beam system according to claim 7, wherein one can bring probes into contact with points to be inspected by watching the image superimposed on the CAD image.

12. A charged particle beam system according to claim 7, further comprising:
    a means for placing the sample by movement in X, Y and Z directions, the means for placing further comprising:
    a first stage having a sample placing surface;
    a first stage driving unit for driving the first stage;
    a second stage on which the probe driving unit and the first stage are built;
    a second stage driving unit for moving the second stage;
    a probe driving unit for driving the plurality of probes; and
    a controlling unit for controlling the probe driving unit, the first stage driving unit, and the second stage driving unit.

13. An electron beam system comprising:
    a plurality of probes to detect an electrical current or voltage or electrical signal from the sample, each of the probes having a tip to contact a sample;

an electro-optical system to irradiate the sample with an electron beam and to obtain a SEM image of the sample by detecting secondary electrons resulting from irradiation of the electron beam;

a measuring instrument to measure the electrical characteristics of the sample based on the electrical current or the voltage or the electrical signal detected by the probe;

a computer connected to a storage device to store a CAD image of layout pattern of the sample, and a display to display the SEM image superimposed on the CAD image.

14. An electron beam system according to claim 13, wherein the SEM image and the CAD image are displayed on the display after tips of all probe to measure electrical characteristics of the sample embrace in the SEM image.

15. A charged particle beam system according to claim 14, wherein the SEM image and the CAD image are displayed on the display before the tip of the probe contacts the sample.

16. A charged particle beam system according to claim 13, wherein the SEM image and the CAD image are displayed on the display before the tip of the probe contacts the sample.

17. A charged particle beam system according to claim 13, wherein one can bring probes into contact with points to be inspected by watching the SEM image superimposed on the CAD image.

18. A charged particle beam system according to claim 13, further comprising:
 a first stage having a sample placing surface;
 a first stage driving unit for driving the first stage;
 a second stage on which the probe driving unit and the first stage are built;
 a second stage driving unit for moving the second stage;
 a probe driving unit for driving the plurality of probes; and
 a controlling unit for controlling the probe driving unit, the first stage driving unit, and the second stage driving unit.

* * * * *

UNITED STATES PATENT AND TRADEMARK OFFICE
CERTIFICATE OF CORRECTION

PATENT NO. : 7,598,755 B2  Page 1 of 1
APPLICATION NO. : 12/118421
DATED : October 6, 2009
INVENTOR(S) : Furukawa et al.

It is certified that error appears in the above-identified patent and that said Letters Patent is hereby corrected as shown below:

On the Title Page
Item (63), please amend the following:

Continuation of application No. 11/397,677, filed on Apr. 5, 2006, now Pat. No. 7,372,283, which is a continuation of application No. 11/018,356, filed Dec. 22, 2004, now Pat. No. 7,071,713.

On the Title Page
Please add the following Items:

Item (30) Foreign Application Priority Data

Dec. 24, 2003 (JP) 2003-426169
Oct. 12, 2004 (JP) 2004-297115

Signed and Sealed this

Twenty-sixth Day of January, 2010

David J. Kappos
*Director of the United States Patent and Trademark Office*